(12) United States Patent
Fisher

(10) Patent No.: US 12,183,669 B2
(45) Date of Patent: Dec. 31, 2024

(54) CONFIGURABLE METAL—INSULATOR—METAL CAPACITOR AND DEVICES

(71) Applicant: WOLFSPEED, INC., Durham, NC (US)

(72) Inventor: Jeremy Fisher, Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/554,971

(22) Filed: Dec. 17, 2021

(65) Prior Publication Data
US 2023/0197597 A1   Jun. 22, 2023

(51) Int. Cl.
| | | |
|---|---|---|
| *H01L 23/52* | (2006.01) | |
| *H01L 23/522* | (2006.01) | |
| *H01L 23/64* | (2006.01) | |
| *H01L 27/08* | (2006.01) | |
| *H01L 49/02* | (2006.01) | |

(52) U.S. Cl.
CPC ...... *H01L 23/5223* (2013.01); *H01L 23/5226* (2013.01); *H01L 23/642* (2013.01); *H01L 27/0805* (2013.01); *H01L 28/40* (2013.01); *H01L 28/60* (2013.01)

(58) Field of Classification Search
CPC ............ H01L 23/5223; H01L 23/5226; H01L 27/0805; H01L 28/40; H01L 28/60; H01L 23/642
See application file for complete search history.

(56) References Cited

U.S. PATENT DOCUMENTS

| | | | |
|---|---|---|---|
| 7,078,310 B1 * | 7/2006 | Kar-Roy | H01L 28/60 257/532 |
| 8,143,699 B2 | 3/2012 | Ching et al. | |
| 9,153,504 B2 * | 10/2015 | Lai | H01L 28/60 |
| 9,966,426 B2 * | 5/2018 | Mudakatte | H01L 23/5223 |
| 10,290,701 B1 | 5/2019 | Chang | |
| 2004/0061214 A1 | 4/2004 | Crescenzi | |
| 2005/0121744 A1 | 6/2005 | Chang et al. | |
| 2007/0297120 A1 | 12/2007 | Ren et al. | |
| 2011/0031586 A1 * | 2/2011 | Kang | H01L 27/0805 257/532 |
| 2013/0264716 A1 | 10/2013 | Lin et al. | |
| 2014/0036405 A1 | 2/2014 | Takeoka et al. | |

(Continued)

OTHER PUBLICATIONS

International Patent Application No. PCT/US2022/081752; Int'l Search Report and the Written Opinion; dated Sep. 21, 2023; 12 pages.

(Continued)

*Primary Examiner* — Shouxiang Hu
(74) *Attorney, Agent, or Firm* — BakerHostetler

(57) ABSTRACT

A metal-insulator-metal (MIM) capacitor component that includes a substrate, where the metal-insulator-metal (MIM) capacitor component is configured to form a first capacitor with a top metal and a first bottom metal having a dielectric layer therebetween; and where the metal-insulator-metal (MIM) capacitor component is configured to form a second capacitor with the top metal and a second bottom metal having the dielectric layer therebetween. Additionally, the top metal, the dielectric layer, the first bottom metal, and the second bottom metal are arranged on the substrate.

28 Claims, 15 Drawing Sheets

(56) References Cited

U.S. PATENT DOCUMENTS

| | | |
|---|---|---|
| 2015/0244410 A1 | 8/2015 | Leong et al. |
| 2018/0131329 A1 | 5/2018 | Tong |
| 2018/0323159 A1 | 11/2018 | Kamgaing et al. |
| 2020/0227366 A1 | 7/2020 | Dogiamis et al. |
| 2020/0411555 A1 | 12/2020 | Hall et al. |
| 2021/0265249 A1 | 8/2021 | Komposch et al. |
| 2021/0265250 A1 | 8/2021 | Marbell et al. |
| 2021/0313285 A1 | 10/2021 | Noori et al. |
| 2021/0313293 A1 | 10/2021 | Noori et al. |
| 2021/0391234 A1 | 12/2021 | Lan et al. |

OTHER PUBLICATIONS

International Patent Application No. PCT/US2022/081740; Int'l Search Report and the Written Opinion; dated Mar. 10, 2023; 9 pages.

International Patent Application No. PCT/US2022/081759; Int'l Search Report and the Written Opinion; dated Mar. 16, 2023; 11 pages.

\* cited by examiner

CONFIGURABLE METAL—INSULATOR—METAL CAPACITOR AND DEVICES

FIELD OF THE DISCLOSURE

The disclosure relates to a configurable metal-insulator-metal (MIM) capacitor. The disclosure further relates to devices implementing a configurable MIM capacitor. The disclosure further relates to processes implementing a configurable MIM capacitor. The disclosure further relates to processes implementing devices with a configurable MIM capacitor.

BACKGROUND OF THE DISCLOSURE

A metal-insulator-metal (MIM) capacitor typically includes parallel plates formed by two metal planes separated by a thin dielectric. A typical implementation of a MIM capacitor is structured and configured only for specific limited implementations, applications, and/or the like. This limits the applicability of particular MIM capacitors and requires a number of different types of MIM capacitors for various applications. Accordingly, this results in increased manufacturing complexity, increased Bill of Materials (BOM) cost, increased overall costs, and/or the like.

Accordingly, what is needed is a MIM capacitor that is configurable for a number of different implementations, configurations, applications, and/or the like.

SUMMARY OF THE DISCLOSURE

One general aspect includes a metal-insulator-metal (MIM) capacitor component that includes a substrate; a dielectric layer; a top metal; a first bottom metal; a second bottom metal; a first metallization layer; and a second metallization layer, where the metal-insulator-metal (MIM) capacitor component is configured to form a first capacitor with the top metal and the first bottom metal having the dielectric layer therebetween; where the metal-insulator-metal (MIM) capacitor component is configured to form a second capacitor with the top metal and the second bottom metal having the dielectric layer therebetween; and where the top metal, the dielectric layer, the first bottom metal, and the second bottom metal are arranged on the substrate.

One general aspect includes a process of implementing a metal-insulator-metal (MIM) capacitor component that includes providing a substrate; providing a dielectric layer; providing a top metal; providing a first bottom metal; providing a second bottom metal; providing a first metallization layer; providing a second metallization layer; configuring a first capacitor with the top metal and the first bottom metal having the dielectric layer therebetween; and configuring a second capacitor with the top metal and the second bottom metal having the dielectric layer therebetween, where the top metal, the dielectric layer, the first bottom metal, and the second bottom metal are arranged on the substrate.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
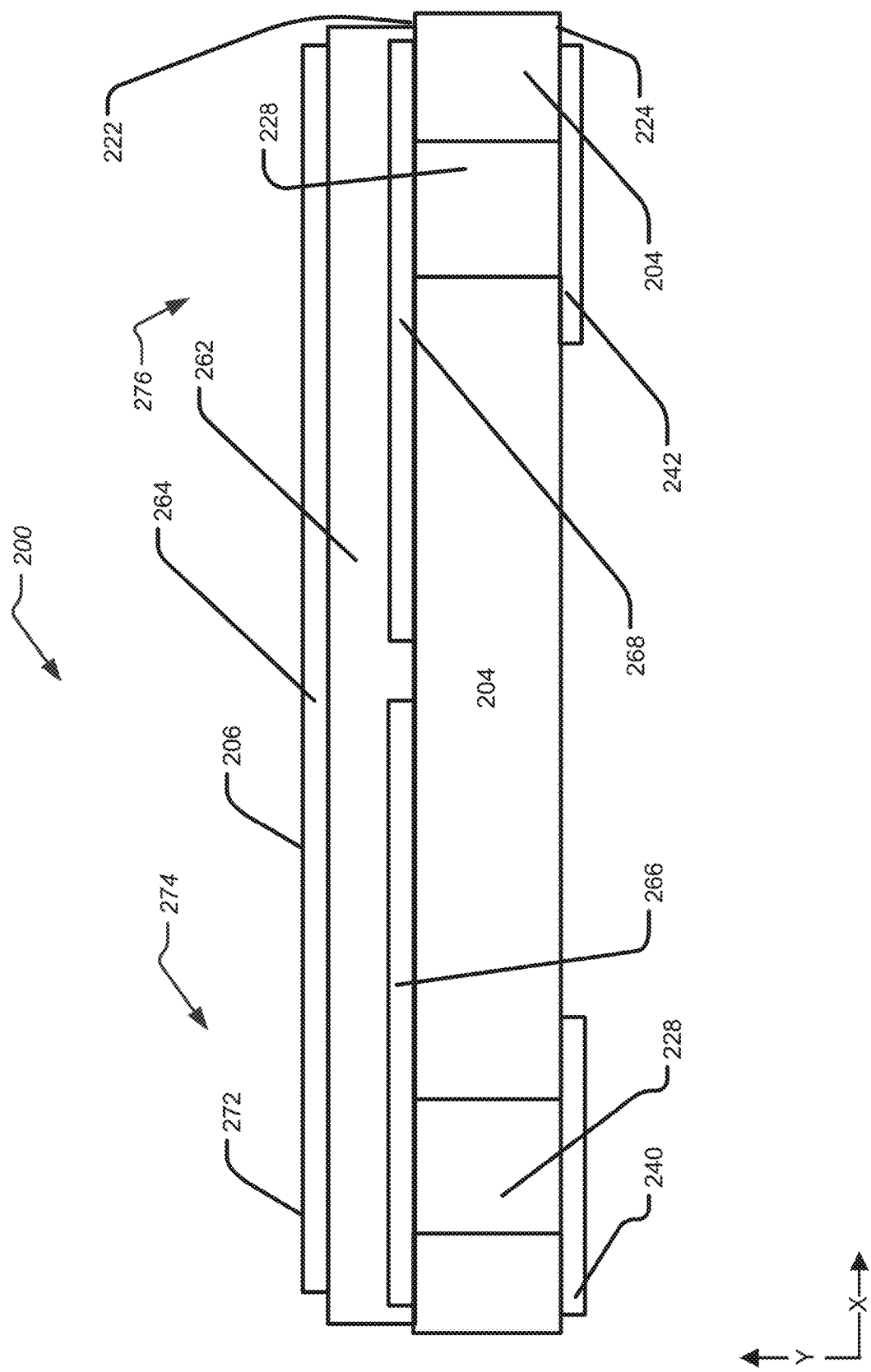
FIG. 1 illustrates a cross-sectional side view of a MIM capacitor component according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A metal-insulator-metal (MIM) capacitor typically includes parallel plates formed by two metal planes separated by a thin dielectric. A first typical implementation of a MIM capacitor can be structured and configured as a series capacitor in a full surface mount device (SMD) configuration. Alternatively, a second typical implementation of a MIM capacitor can be structured and configured as a shunt capacitor, such as a single layer capacitor. However, a typical MIM capacitor cannot be structured and configured to be utilized in both implementations. In other words, the first typical implementation of a MIM capacitor is not configurable and is strictly limited to a SMD configuration; and the second typical implementation of a MIM capacitor is not configurable and is strictly limited to a shunt capacitor configuration. This limits the applicability of particular MIM capacitors and requires a number of different types of MIM capacitors for various applications. Accordingly, this results in increasing manufacturing complexity, Bill of Materials (BOM) cost, costs, and/or the like.

The disclosure is directed to a configurable MIM capacitor. The configurable MIM capacitor may be used in packaged discrete Radio Frequency (RF) power transistors, Power Amplifier Modules (PAMs), packaged Monolithic Microwave Integrated Circuits (MMICs), and/or the like. The configurable MIM capacitor may be used in other applications that could include any electrical circuit, application, and/or the like that uses a discrete series capacitor, a shunt capacitor, and/or the like or has need to have an optional series configuration or shunt configuration at a point in a circuit, or reusability of a given value capacitor.

The disclosure is further directed to a MIM capacitor that may be fabricated on a Silicon Carbide (SiC) substrate, that may be laid out in such a way that the MIM capacitor can behave as a series capacitor when assembled as an SMD with each port separately connected to different ports, or the MIM capacitor can behave as a shunt capacitor when both ports are connected to the same node and the top plate of the MIM capacitor connected to a different node through a bondwire or other vertical connection. This allows a single capacitor to be configured such that it provides C/2 pF of capacitance in the first instance, and 2C pF in the second instance, and can alternately be configured for series or shunt use by configuring for strictly SMD or SMD/bonded assembly. This provides reconfigurability and can be used to implement BOM reduction and cost savings.

A cross section of the MIM capacitor is shown in the Figures. The MIM capacitor includes a continuous top plate, a dielectric layer that may be continuous or segmented, and a bottom plate that is segmented into at least two sections. The bottom plates are connected to segmented backside metallization using through vias. A separate capacitor is then defined by the area of the bottom plate and the thickness and dielectric constant of the dielectric, and may have an independent and isolated region on the backside for electrical connection.

The usage and value of the capacitor is determined by the assembly, as shown in the figures. Strict SMD style assembly may result in a series capacitor, while a shunt configuration may be achieved by bonding to the top plate for one node, and using the SMD attach on one or both capacitors for the other node.

Other embodiments may use multiple sections to further vary the series and/or shunt capacitor values, use of the "Shunt" assembly style in a series circuit configuration, use of multiple nodes concurrently in a "ladder" or divider configuration. Additionally, the MIM capacitor may attach to a carrier using other methods such as pillars, bumps, solder bumping, a Cu bump, a Cu pillar, and/or the like and attach to the top plate through other methods such as pillars, bumps, solder bumping, a Cu bump, a Cu pillar, and/or the like. The MIM capacitor may also be integrated onto a MMIC where the top or bottom plates are part of a larger integrated circuit and the opposite plate is used as an intermediate or alternate attach where multiple capacitor values are needed. Additionally, the disclosed MIM capacitor may be implemented in any application that requires a capacitor and can benefit from reconfigurability, multi-capacitor integration, benefit by lowering BOM related cost, and/or the like.

The disclosure further relates to devices implementing a configurable MIM capacitor such as a packaged discrete Radio Frequency (RF) power transistor, a Power Amplifier Module (PAM), a packaged Monolithic Microwave Integrated Circuit (MMIC), applications implementing a discrete series capacitor, a shunt capacitor, and/or the like. The disclosure relates to processes implementing a configurable MIM capacitor. The disclosure further relates to processes implementing devices with a configurable MIM capacitor such as a packaged discrete Radio Frequency (RF) power transistor, a Power Amplifier Module (PAM), a packaged Monolithic Microwave Integrated Circuit (MMIC), applications implementing a discrete series capacitor, a shunt capacitor, and/or the like.

FIG. 1 illustrates a cross-sectional side view of a MIM capacitor component according to the disclosure.

Figure 2:
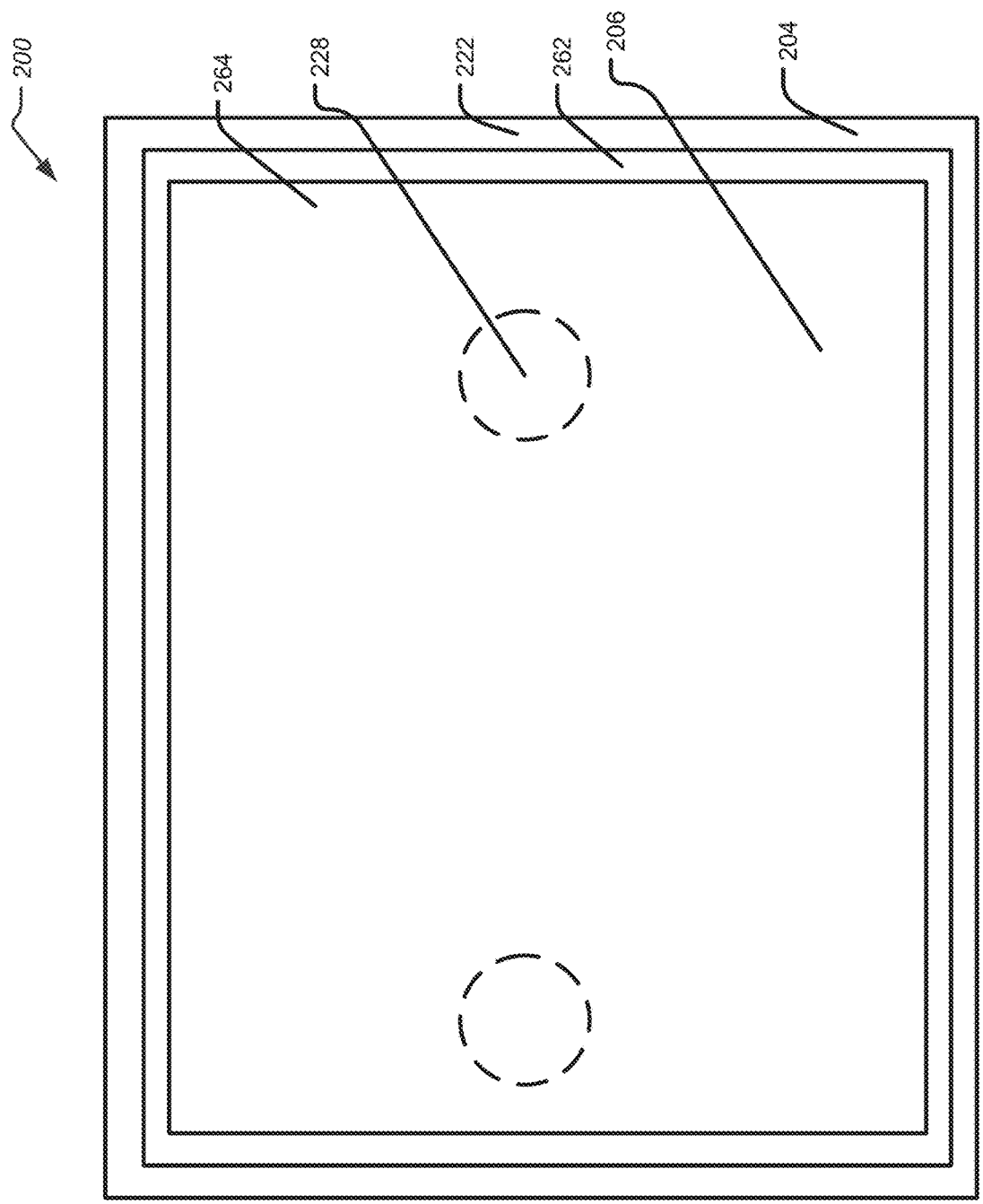
FIG. 2 illustrates a top view of a MIM capacitor component according to FIG. 1.

FIG. 2 illustrates a top view of a MIM capacitor component according to FIG. 1.

Figure 3:
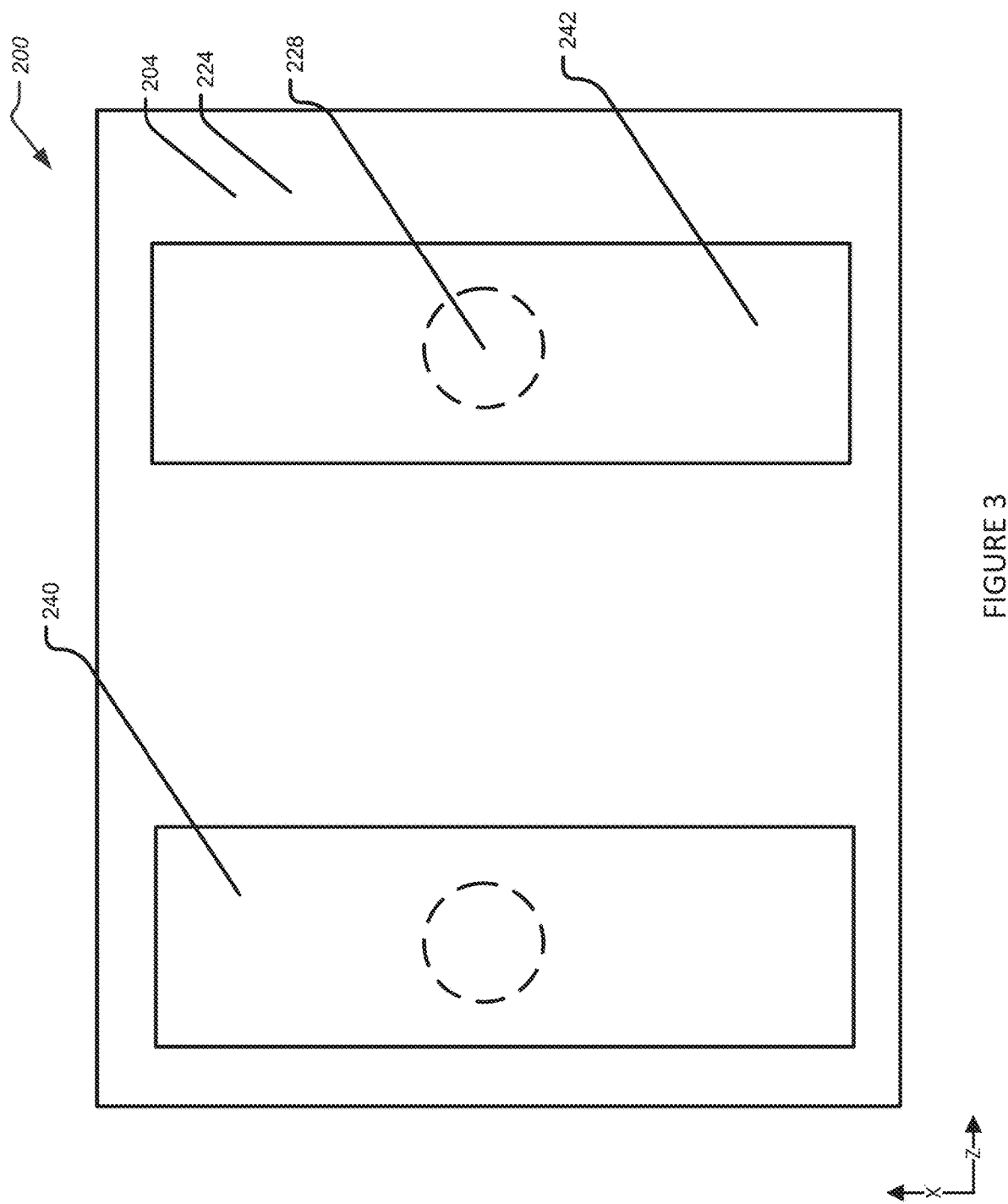
FIG. 3 illustrates a bottom view of a MIM capacitor component according to FIG. 1.

FIG. 3 illustrates a bottom view of a MIM capacitor component according to FIG. 1.

FIG. 1, FIG. 2, and FIG. 3 may include any one or more other features, components, arrangements, and the like as described herein. In particular, FIG. 1 illustrates at least one MIM capacitor component 200 that may configurable such that that the at least one MIM capacitor component 200 may be arranged and connected in such a way that at least one MIM capacitor component 200 can behave as a series capacitor when assembled as an SMD with each port separately connected to different ports; and the at least one MIM capacitor component 200 that may configurable such that that the at least one MIM capacitor component 200 may be arranged and connected in such a way that at least one MIM capacitor component 200 can behave as a shunt capacitor when both ports are connected to the same node and the top plate of the MIM capacitor connected to a different node.

The at least one MIM capacitor component 200 may include a substrate 204, a dielectric layer 262, a top metal 264, a first bottom metal 266, a second bottom metal 268, a first metallization layer 240, a second metallization layer 242, and/or the like. In particular, the at least one MIM capacitor component 200 may form a first capacitor 274 with the top metal 264 and the first bottom metal 266 having the dielectric layer 262 therebetween; and the at least one MIM capacitor component 200 may form a second capacitor 276 with the top metal 264 and the second bottom metal 268 having the dielectric layer 262 therebetween.

In aspects, the disclosed at least one MIM capacitor component 200 may be fabricated on a Silicon Carbide (SiC) substrate, that may be laid out in such a way that the at least one MIM capacitor component 200 can behave as a series capacitor when assembled as an SMD with each port separately connected to different ports, or the at least one MIM capacitor component 200 can behave as a shunt capacitor when both ports are connected to the same node and the top plate or top metal 264 of the at least one MIM capacitor component 200 is connected to a different node through a bondwire or other vertical connection. This allows a single capacitor to be configured such that it provides C/2 pF of capacitance in the first instance, and 2C pF in the second instance, and can alternately be configured for series or shunt use by configuring for strictly SMD or SMD/bonded assembly. This provides reconfigurability and can be used to implement BOM reduction and cost savings.

A cross section of the at least one MIM capacitor component 200 is shown in FIG. 1. The at least one MIM capacitor component 200 may include a continuous top plate or top metal 264, a dielectric layer 262 that may be continuous or segmented, and a bottom plate or first bottom metal 266 and second bottom metal 268 that may be segmented into at least two sections. The bottom plates may be connected to segmented backside metallization, such as the first metallization layer 240 and the second metallization layer 242, using through vias 228. A separate capacitor may be then defined by the area of the bottom plate and the thickness and dielectric constant of the dielectric layer 262, and may have an independent and isolated region on the backside for electrical connection.

The usage and value of the at least one MIM capacitor component 200 may be determined by the assembly, as shown in the figures. Strict SMD style assembly may result in a series capacitor, while a shunt configuration may be achieved by bonding to the top plate for one node, and using the SMD attach on one or both capacitors for the other node.

Other embodiments may use multiple sections to further vary the series and/or shunt capacitor values, use of the "Shunt" assembly style in a series circuit configuration, use of multiple nodes concurrently in a "ladder" or divider configuration. Additionally, the at least one MIM capacitor component 200 may attach to a carrier using other methods such as pillars, bumps, solder bumping, a Cu bump, a Cu pillar, and/or the like and attach to the top plate through other methods such as pillars, bumps, solder bumping, a Cu bump, a Cu pillar, and/or the like. The at least one MIM capacitor component 200 may also be integrated onto a MMIC where the top or bottom plates are part of a larger integrated circuit and the opposite plate is used as an intermediate or alternate attach where multiple capacitor values are needed. Additionally, the disclosed MIM capacitor may be implemented in any application that requires a capacitor and can benefit from reconfigurability, multi-capacitor integration, benefit by lowering BOM related cost, and/or the like.

The top metal 264 may be arranged parallel to the x-axis as illustrated, the top metal 264 may be continuous and arranged parallel the first bottom metal 266 and the second bottom metal 268. Moreover, the top metal 264 may be arranged vertically above the first bottom metal 266 and the second bottom metal 268 along the y-axis as illustrated. In some aspects, a center portion of the top metal 264 along the x-axis as illustrated may be arranged between the first bottom metal 266 and the second bottom metal 268. In some aspects, a first side edge of the top metal 264 along the x-axis as illustrated may be generally or substantially aligned with an edge of the first bottom metal 266 and a second side edge of the top metal 264 along the x-axis as illustrated may be generally or substantially aligned with an edge of the second bottom metal 268. In some aspects, a first side edge of the top metal 264 along the x-axis as illustrated may be aligned with an edge of the first bottom metal 266 and a second side edge of the top metal 264 along the x-axis as illustrated may be aligned with an edge of the second bottom metal 268. Additionally, the at least one MIM capacitor component 200 may arrange the top metal 264, the dielectric layer 262, the first bottom metal 266, and the second bottom metal 268 on the substrate 204.

The substrate 204 may include silicon carbide (SiC). The substrate 204 may be made of Silicon Carbide (SiC). In some aspects, the substrate 204 may be a semi-insulating SiC substrate, a p-type substrate, an n-type substrate, and/or the like. In some aspects, the substrate 204 may be very lightly doped. In one aspect, the substrate 204 may be formed of SiC selected from the group of 6H, 4H, 15R, 3C SiC, or the like. In one aspect, the substrate 204 may be formed of SiC that may be semi-insulating and doped with vanadium or any other suitable dopant or undoped of high purity with defects providing the semi-insulating properties. In other aspects, the substrate 204 may include silicon, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material. The substrate 204 may include an upper surface 222. The upper surface 222 may support the first bottom metal 266 and the second bottom metal 268.

The first bottom metal 266 and the second bottom metal 268 may be arranged on the upper surface 222 of the substrate 204. In particular, there may be one or more intervening layers or structures between the upper surface 222 of the substrate 204 and the first bottom metal 266 (not shown); and there may be one or more intervening layers or structures between the upper surface 222 of the substrate 204 and the second bottom metal 268 (not shown). In other aspects, the first bottom metal 266 may be directly arranged on the upper surface 222 of the substrate 204. In other aspects, the second bottom metal 268 may be directly arranged on the upper surface 222 of the substrate 204. In one aspect, the first bottom metal 266 and/or the second bottom metal 268 may be continuous. In one aspect, the first bottom metal 266 and/or the second bottom metal 268 may be discontinuous or segmented.

The first bottom metal 266 and the second bottom metal 268 may be formed as a metal surface on the upper surface 222 of the substrate 204 and may comprise a metallic material such as copper, gold, nickel, palladium, silver, tin, a gold tin alloy, and the like, and combinations thereof. In one aspect, the first bottom metal 266 and the second bottom metal 268 may have a thickness along the y-axis of 0.1 microns to 0.6 microns, 0.1 microns to 0.2 microns, 0.2 microns to 0.3 microns, 0.3 microns to 0.4 microns, 0.4 microns to 0.5 microns, or 0.5 microns to 0.6 microns.

The dielectric layer 262 may be arranged on the first bottom metal 266 and the second bottom metal 268. In particular, there may be one or more intervening layers or structures between the dielectric layer 262 and the first bottom metal 266 (not shown); and there may be one or more intervening layers or structures between the dielectric layer 262 and the second bottom metal 268 (not shown). In other aspects, the dielectric layer 262 may be directly arranged on the first bottom metal 266; and/or the dielectric layer 262 may be directly arranged on the second bottom metal 268. In one aspect, the dielectric layer 262 may be continuous. The dielectric layer 262 may include SiN, AlO, SiO, $SiO_2$, AlN, or the like or combinations thereof together with other intervening layers. The dielectric layer 262 may have any thickness along a y-axis to provide the desired capacitance density, capacitance, standoff voltage, and/or the like. In some aspects, the dielectric layer 262 may have a thickness along the y-axis of 100 Å to 11000 Å, 100 Å to 1000 Å, 1000 Å to 2000 Å, 2000 Å to 3000 Å, 3000 Å to 4000 Å, 4000 Å to 5000 Å, 5000 Å to 6000 Å, 6000 Å to 7000 Å, 7000 Å to 8000 Å, 8000 Å to 9000 Å, 9000 Å to 10000 Å, or 10000 Å to 11000 Å. In some aspects, the dielectric layer 262 may have a thickness along the y-axis of greater than 10000 Å.

The top metal 264 may be arranged on the dielectric layer 262. In particular, there may be one or more intervening layers or structures between the top metal 264 and the dielectric layer 262 (not shown). In other aspects, the top metal 264 may be directly arranged on the dielectric layer 262. The top metal 264 may be formed as a metal surface on an upper surface the dielectric layer 262 and may comprise a metallic material such as copper, gold, nickel, palladium, silver, tin, a gold tin alloy, and the like, and combinations thereof. In some aspects, the top metal 264 may comprise stacked layers. In one aspect, the top metal 264 may have a thickness along the y-axis of 0.1 microns to 7 microns, 0.1 microns to 0.2 microns, 0.2 microns to 0.3 microns, 0.3 microns to 0.4 microns, 0.4 microns to 0.5 microns, 0.5 microns to 0.6 microns, 0.6 microns to 0.7 microns, 0.7 microns to 1 microns, 1 microns to 2 microns, 2 microns to 3 microns, 3 microns to 4 microns, 4 microns to 5 microns, 5 microns to 6 microns, or 6 microns to 7 microns.

The substrate 204 may include a lower surface 224. The at least one MIM capacitor component 200 may include the first metallization layer 240 and the second metallization layer 242 located on a lower surface 224 of the substrate 204 opposite the upper surface 222 and/or the lower surface 224. The first metallization layer 240 and the second metallization layer 242 may be located in a plane generally parallel to the x-axis or a plane generally parallel to the upper surface 222. In one aspect, the first metallization layer 240 and/or the second metallization layer 242 may be continuous. In one aspect, the first metallization layer 240 and/or the second metallization layer 242 may be discontinuous or segmented. The first metallization layer 240 and the second metallization layer 242 may comprise a metallic material such as copper, gold, nickel, palladium, silver, tin, a gold tin alloy, and the like, and combinations thereof. In one aspect, the first metallization layer 240 may have a thickness along the y-axis of 1 microns to 9 microns, 1 microns to 2 microns, 2 microns to 3 microns, 3 microns to 4 microns, 4 microns to 5 microns, 5 microns to 6 microns, 6 microns to 7 microns, 7 microns to 8 microns, or 8 microns to 9 microns.

Additionally, the at least one MIM capacitor component 200 may include an electrical connection such as vias 228. However, any type of electrical connection is contemplated. In particular aspects, the substrate 204 of the at least one MIM capacitor component 200 may include the vias 228 extending along the y-axis through the substrate 204. One or more of the vias 228 may be electrically connected to the first metallization layer 240; and one or more of the vias 228 may be electrically connected to the second metallization layer 242. Additionally, the one or more of the vias 228 may be electrically connected to the first bottom metal 266; and the one or more the vias 228 may be electrically connected to the second bottom metal 268.

The vias 228 may be metallic plated holes or metallic filled holes that may function as electrical tunnels through the substrate 204. The vias 228 may comprise a metallic material such as copper, gold, nickel, palladium, silver, tin, a gold tin alloy, and the like, and combinations thereof. The vias 228 may have an axis that may be located in a plane generally perpendicular to the x-axis, a plane generally parallel to the x-axis, and/or a plane generally perpendicular to the upper surface 222.

The at least one MIM capacitor component 200 may be implemented as a shunt capacitor such that the upper surface 272 of the top metal 264 may form a first connection pad 206 for the first capacitor 274 and the second capacitor 276. Additionally, the first metallization layer 240 may form a second connection for the first capacitor 274; and the second metallization layer 242 may form a second connection for the second capacitor 276. Accordingly, the first capacitor 274 may be formed by the top metal 264 and the first bottom metal 266 and electrically connected by the first connection pad 206 and the first metallization layer 240. Similarly, the second capacitor 276 may be formed by the top metal 264 and the second bottom metal 268 and electrically connected by the first connection pad 206 and the second metallization layer 242.

The at least one MIM capacitor component 200 may be implemented as a series capacitor such that the upper surface 272 of the top metal 264 may connect to the second capacitor 276. Additionally, the first metallization layer 240 may form a second connection for the first capacitor 274; and the second metallization layer 242 may form a second connection for the second capacitor 276. Accordingly, the first capacitor 274 may be formed by the top metal 264 and the first bottom metal 266 and electrically connected by the first metallization layer 240. Similarly, the second capacitor 276 may be formed by the top metal 264 and the second bottom metal 268 and electrically connected by the top metal 264 to the first capacitor 274 and the second metallization layer 242.

The first metallization layer 240 may form a first connection, node, and/or port, for the at least one MIM capacitor component 200; the top metal 264 and/or the first connection pad 206 may form a second connection, node, and/or port, for the at least one MIM capacitor component 200; and the second metallization layer 242 may form a third connection, node, and/or port, for the at least one MIM capacitor component 200. In this regard, connections made to the first, second, and third connection, node, and/or port, of the at least one MIM capacitor component 200 provide configurability for the at least one MIM capacitor component 200 to be utilized in a number of different configurations, implementations, applications, and/or the like.

Accordingly, the first capacitor 274 and the second capacitor 276 may form separate capacitors. The capacitance of the first capacitor 274 and the second capacitor 276 may then defined by the area of the first bottom metal 266 and the second bottom metal 268 and the thickness and dielectric constant of the dielectric layer 262, and may have an independent and isolated region on a backside of the substrate 204 for electrical connection by the first metallization layer 240 and the second metallization layer 242. The capacitance of the first capacitor 274 and the second capacitor 276 may be the same; or the capacitance of the first capacitor 274 and the second capacitor 276 may be different.

Figure 7:
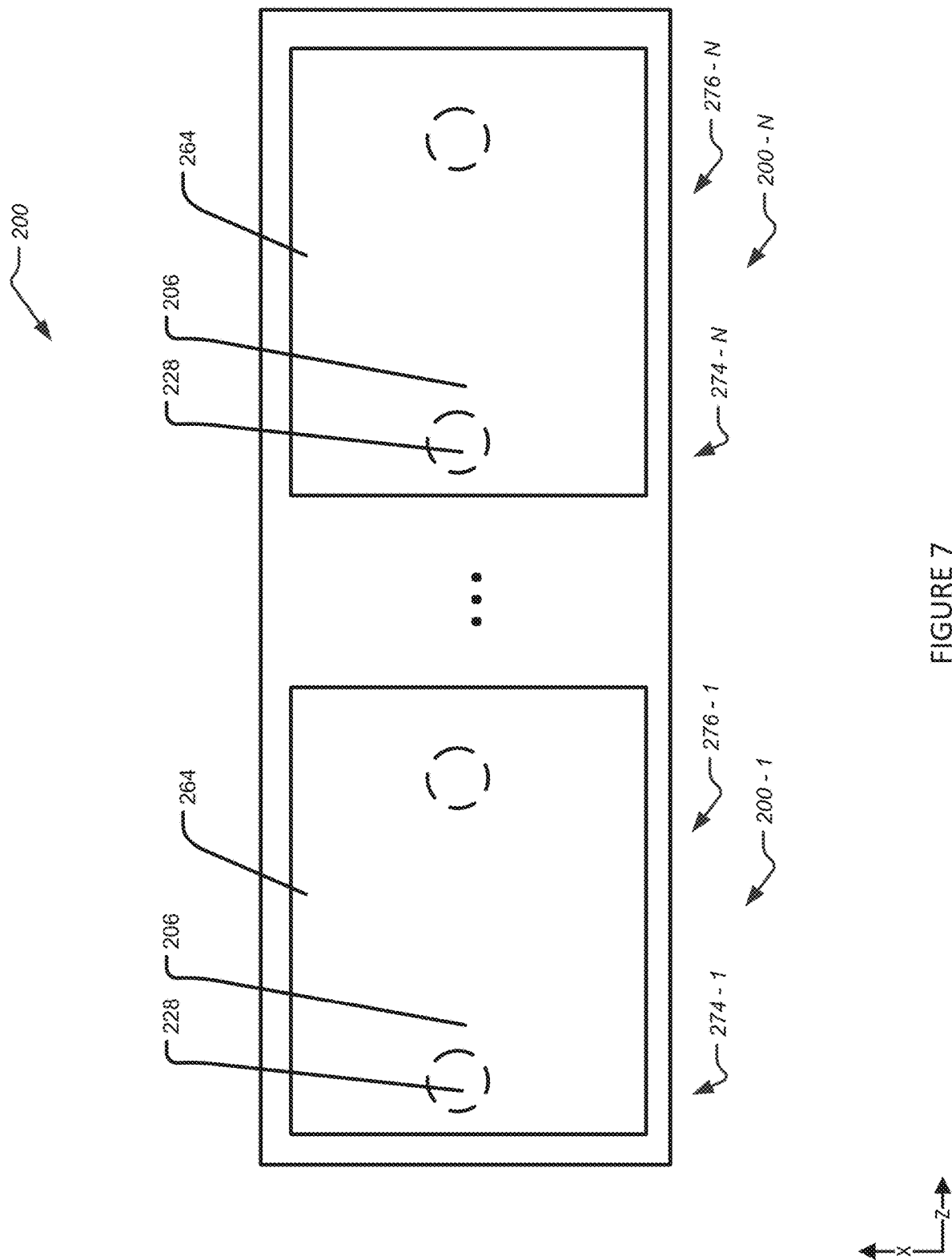
FIG. 7 illustrates a top side view of another aspect of a MIM capacitor component according to the disclosure.

In various aspects, the at least one MIM capacitor component 200 may be implemented with multiple sections as illustrated in FIG. 7. Alternatively, there may be multiple implementations of the at least one MIM capacitor component 200. In this regard, the at least one MIM capacitor component 200 implemented with multiple sections or multiple implementations of the at least one MIM capacitor component 200 may be utilized and may accordingly have multiple nodes. The multiple nodes may be connected and/or connected to additional circuit components in a ladder configuration, a voltage multiplier configuration, a voltage divider configuration, and/or the like multiple capacitor configurations.

In aspects, one or more of the upper surface 222, the first bottom metal 266, the second bottom metal 268, the top metal 264, and the first metallization layer 240, the second metallization layer 242, the first connection pad 206, and/or the lower surface 224 may be located in a plane generally parallel to the x-axis as illustrated. In this regard, generally may be defined to be within 0°-15°, 0°-2°, 2°-4°, 4°-6°, 6°-8°, 8°-10°, 10°-12°, or 12°-15°.

Figure 4:
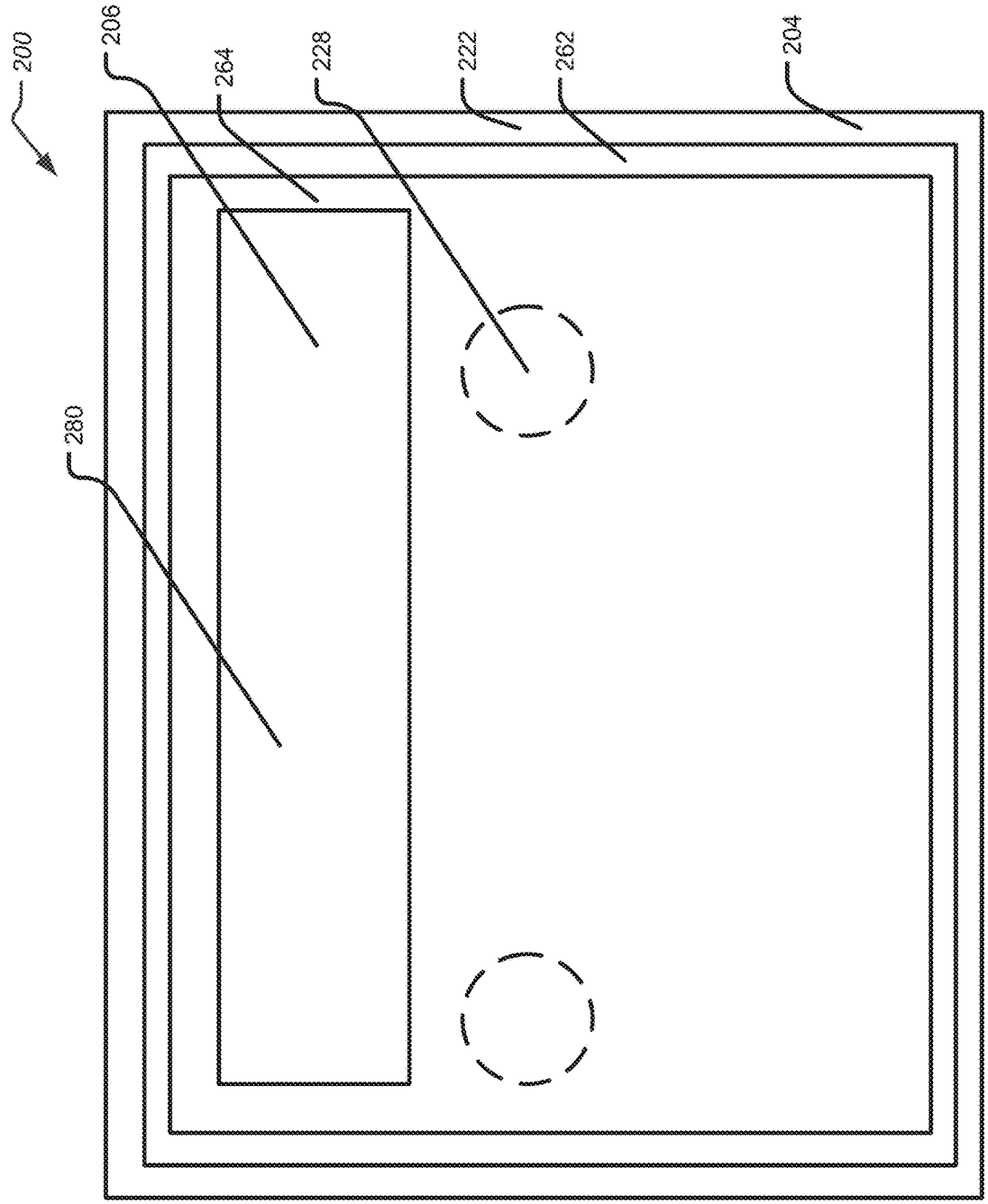
FIG. 4 illustrates a top side view of another aspect of a MIM capacitor component according to the disclosure.

FIG. 4 illustrates a top side view of another aspect of a MIM capacitor component according to the disclosure.

Figure 5:
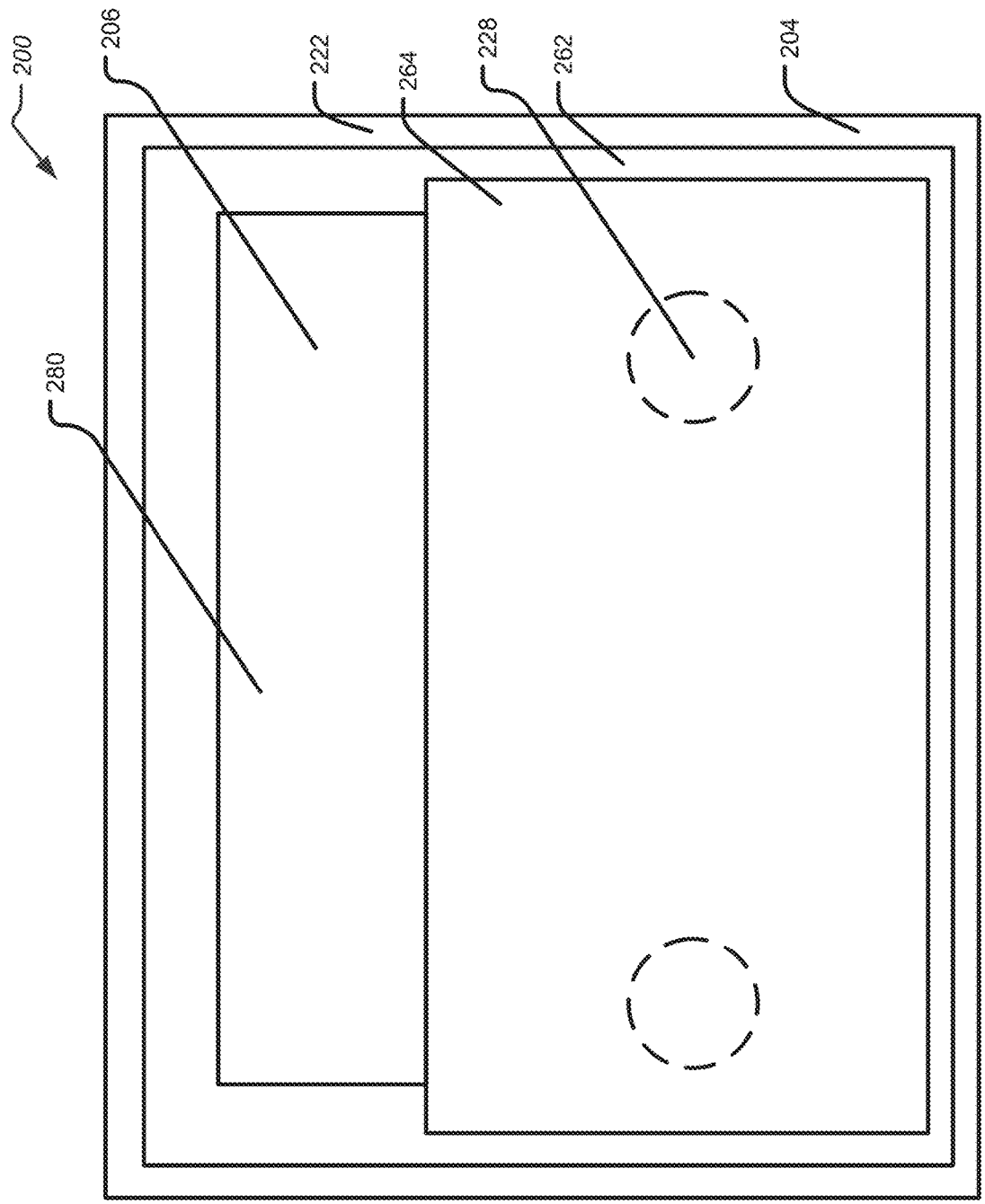
FIG. 5 illustrates a top side view of another aspect of a MIM capacitor component according to the disclosure.

FIG. 5 illustrates a top side view of another aspect of a MIM capacitor component according to the disclosure.

FIG. 4 and FIG. 5 may include any one or more other features, components, arrangements, and the like as described herein. In particular, FIG. 4 FIG. 5 illustrate that the first connection pad 206 may include bond pad areas 280 that are separate from the top metal 264. The bond pad areas 280 of the first connection pad 206 may be formed by a metal surface on an upper surface of the top metal 264 as illustrated in FIG. 4 and may comprise a metallic material such as copper, gold, nickel, palladium, silver, and the like, and combinations thereof. The bond pad areas 280 may be electrically connected to the top metal 264.

Alternatively or additionally, the bond pad areas 280 of the first connection pad 206 may be formed by a metal surface on an upper surface of the dielectric layer 262 adjacent the top metal 264 as illustrated in FIG. 5 and may comprise a metallic material such as copper, gold, nickel, palladium, silver, tin, a gold tin alloy, and the like, and combinations thereof. The bond pad areas 280 may be electrically connected to the top metal 264. Additionally, the bond pad areas 280 may be located anywhere with respect to the at least one MIM capacitor component 200 and electrically connected to the top metal 264.

Figure 6:
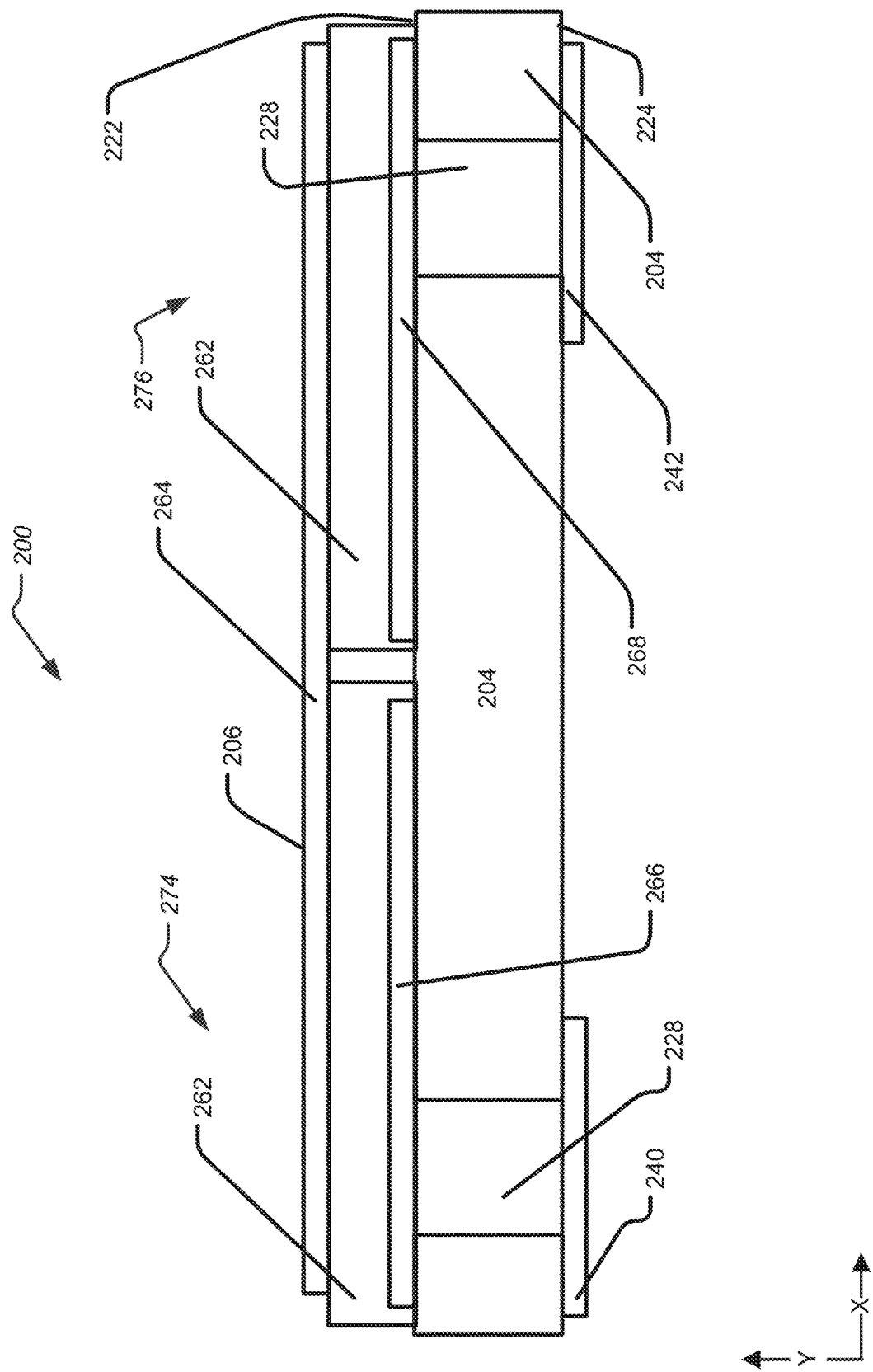
FIG. 6 illustrates a cross-sectional side view of another MIM capacitor component according to the disclosure.

FIG. 6 illustrates a cross-sectional side view of another MIM capacitor component according to the disclosure.

FIG. 6 may include any one or more other features, components, arrangements, and the like as described herein. In particular aspects, FIG. 6 illustrates aspects where the dielectric layer 262 comprises a discontinuous construction of the dielectric layer 262 and/or multiple portions of the dielectric layer 262.

FIG. 7 illustrates a top side view of another aspect of a MIM capacitor component according to the disclosure.

FIG. 7 may include any one or more other features, components, arrangements, and the like as described herein. In particular, FIG. 7 illustrates the at least one MIM capacitor component 200 implementing a plurality of the top metal 264, the vias 228, and/or the like in order to obtain multiple separate capacitor implementations of the at least one MIM capacitor component 200. In this regard, the aspect of FIG. 7 may include one or more sections or implementations of the substrate 204, the dielectric layer 262, the first bottom metal 266, the second bottom metal 268, the first metallization layer 240, the second metallization layer 242, and/or the like, each of which are not shown in FIG. 7. As illustrated in FIG. 7, the at least one MIM capacitor component 200 may include a first implementation 200-1 that may have a first implementation 274-1 of the first capacitor 274 and a first implementation 276-1 of the second capacitor 276; and the at least one MIM capacitor component 200 may include an Nth implementation 200-N (where N is a whole number greater than 1) that may have a Nth implementation 274-N of the first capacitor 274 and a Nth implementation 276-N of the second capacitor 276. In various aspects, the at least one MIM capacitor component 200 implemented with multiple sections may be have multiple nodes. The multiple nodes may be connected and/or connected to additional circuit components in a ladder configuration, a voltage multiplier configuration, a voltage divider configuration, and/or the like multiple capacitor configurations.

Figure 8:
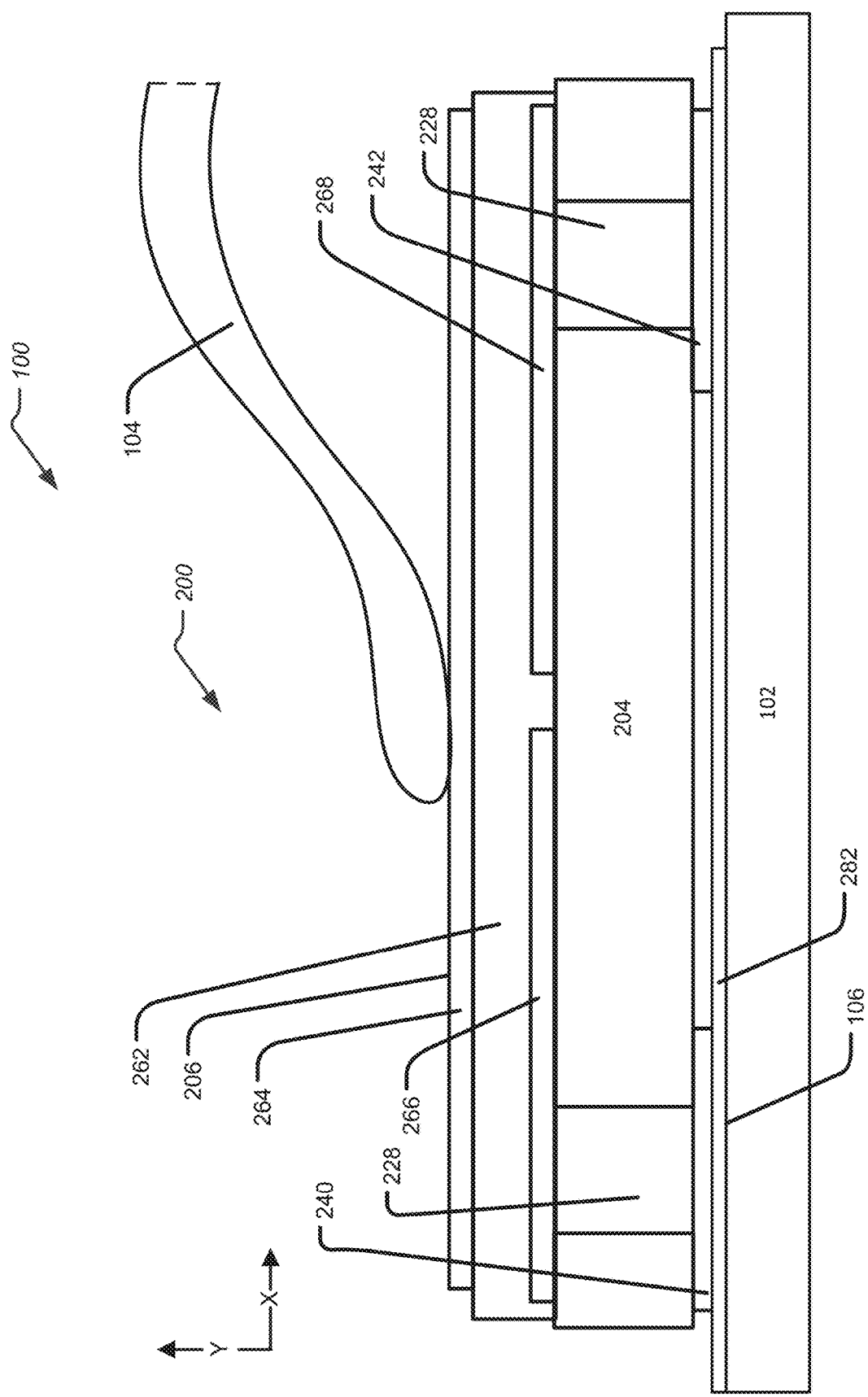
FIG. 8 illustrates a cross-sectional side view of device implementing the MIM capacitor component according to the disclosure.

FIG. 8 illustrates a cross-sectional side view of device implementing the MIM capacitor component according to the disclosure.

FIG. 8 may include any one or more other features, components, arrangements, and the like as described herein. In particular, FIG. 8 illustrates a device 100 that may implement the at least one MIM capacitor component 200. In aspects, the device 100 may include a plurality of the at least one MIM capacitor component 200; in aspects the device 100 may include a single implementation of the at least one MIM capacitor component 200; and in aspects the device 100 may include a plurality of implementations of the at least one MIM capacitor component 200. In one aspect, the dielectric layer 262 may be discontinuous or segmented.

The device 100 may include a support component 102. The support component 102 may be a printed circuit board, a MMIC, a support, and/or the like. The device 100 may further include one or more interconnects 104 that may connect to the first connection pad 206. The one or more interconnects 104 may be implemented as one or more wires, wire bonds, leads, clips, and/or the like. Additionally, the device 100 may include one or more connections 282. In the aspect illustrated in FIG. 8, the support component 102 of the device 100 implements a single implementation of the one or more connections 282. The one or more connections 282 may be a pillar, a bump, pad, a surface, a trace, solder bumping, a Cu bump, a Cu pillar, and/or the like on a surface 106 of the support component 102

The one or more interconnects 104 may be include various metal materials including one or more of aluminum, copper, silver, gold, and/or the like. The one or more interconnects 104 may connect to the first connection pad 206 by an adhesive, soldering, sintering, eutectic bonding, thermal compression bonding, ultrasonic bonding/welding, a clip component, and/or the like as described herein.

In the configuration illustrated in FIG. 8, the at least one MIM capacitor component 200 can behave as a shunt capacitor when both ports, such as the first metallization layer 240 and the second metallization layer 242, are connected to a same node—the one or more connections 282. Additionally, the top metal 264 and/or the first connection pad 206 of the at least one MIM capacitor component 200 may be connected to a different node through the one or more interconnects 104, such as a bondwire, other vertical connection, and/or the like.

The support component 102 may be implemented as a printed circuit board. The printed circuit board implementation of the support component 102 may include the one or more connections 282 arranged on an upper surface of the printed circuit board implementation of the support component 102. The one or more connections 282 may connect the printed circuit board implementation of the support component 102 to the at least one MIM capacitor component 200. In particular, the one or more connections 282 may connect the printed circuit board implementation of the support component 102 to the first metallization layer 240 and the second metallization layer 242 of the at least one MIM capacitor component 200. The one or more connections 282 may connect by an adhesive, soldering, sintering, eutectic bonding, thermal compression bonding, ultrasonic bonding/welding, a clip component, and/or the like as described herein.

The support component 102 may be implemented as a MMIC. The MMIC implementation of the support component 102 may include one or more connections 282 arranged on an upper surface of the MMIC implementation of the support component 102. The one or more connections 282 may connect the MMIC of the support component 102 to the at least one MIM capacitor component 200. In particular, the one or more connections 282 may connect the MMIC implementation of the support component 102 to the first metallization layer 240 and the second metallization layer 242 of the at least one MIM capacitor component 200. The one or more connections 282 may connect by an adhesive, soldering, sintering, eutectic bonding, thermal compression bonding, ultrasonic bonding/welding, a clip component, and/or the like as described herein. In particular, the MMIC implementation of the support component 102 may be implemented utilizing numerous types of device technology, device topology, semiconductor types, transistor types, with one or more active areas, and the like.

The support component 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support component 102 may include an insulating material, a dielectric material, and/or the like. The one or more connections 282 may connect the metal submount of the support component 102 to the at least one MIM capacitor component 200. In particular, the one or more connections 282 may connect the metal submount implementation of the support component 102 to the first metallization layer 240 and the second metallization layer 242 of the at least one MIM capacitor component 200. The one or more connections 282 may connect by an adhesive, soldering, sintering, eutectic bonding, thermal compression bonding, ultrasonic bonding/welding, a clip component, and/or the like as described herein.

Figure 9:
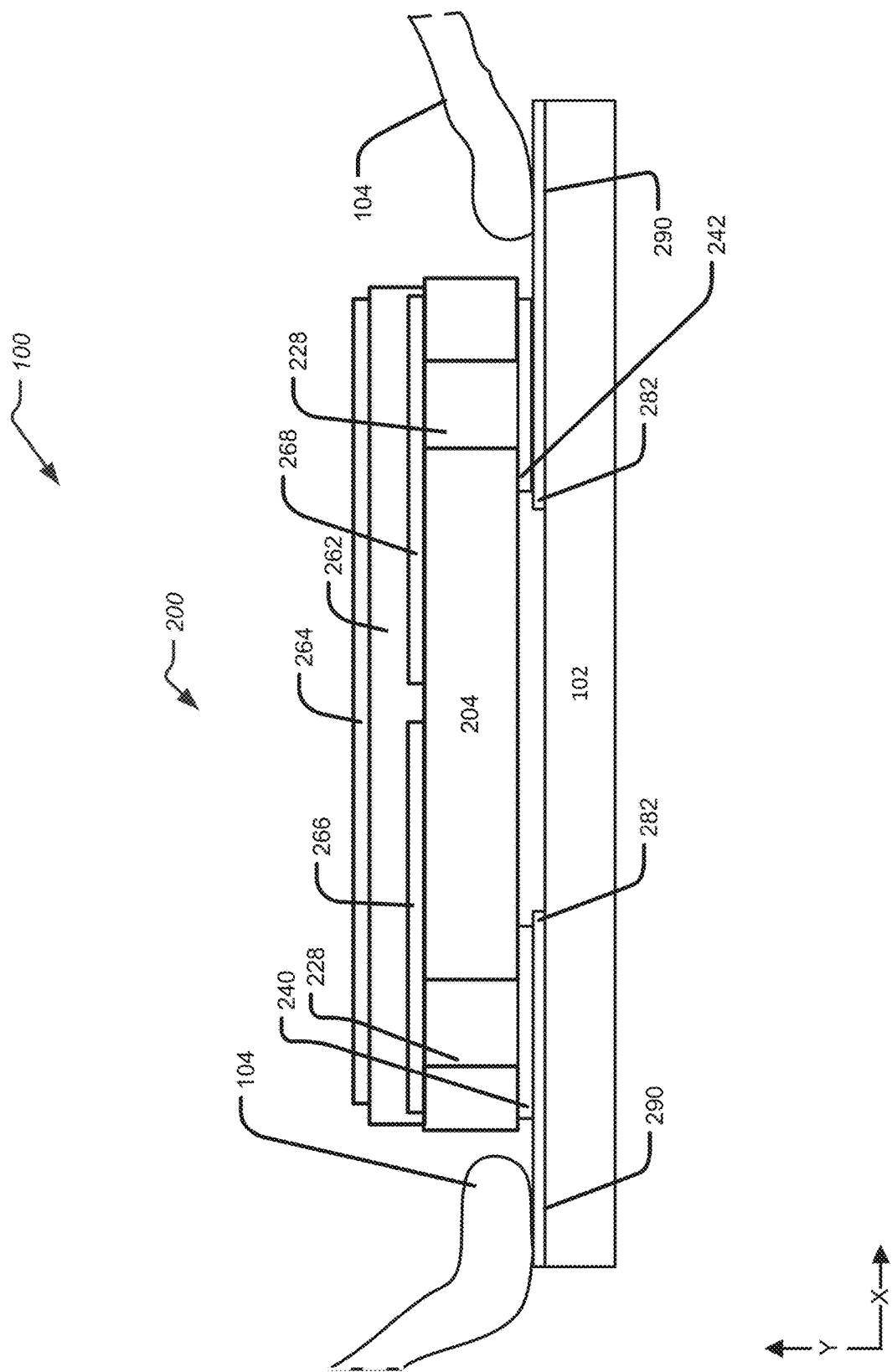
FIG. 9 illustrates a cross-sectional side view of device implementing the MIM capacitor component according to the disclosure.

FIG. 9 illustrates a cross-sectional side view of device implementing the MIM capacitor component according to the disclosure.

FIG. 9 may include any one or more other features, components, arrangements, and the like as described herein. In particular, FIG. 9 illustrates a device 100 that may implement the at least one MIM capacitor component 200. In the aspect illustrated in FIG. 9, the support component 102 of the device 100 implements two implementations of the one or more connections 282. Additionally, in the aspect illustrated in FIG. 9, the one or more connections 282 may extend along the upper surface of the support component 102 to form connection portions 290, such as connections to the one or more interconnects 104.

In the configuration of FIG. 9, the at least one MIM capacitor component 200 is connected and implemented as a SMD. In particular, the at least one MIM capacitor component 200 is configured to behave as a series capacitor when assembled as an SMD with each port—the first metallization layer 240 and the second metallization layer 242 separately connected to different ports of the one or more connections 282 of the support component 102 of the device 100.

Figure 10:
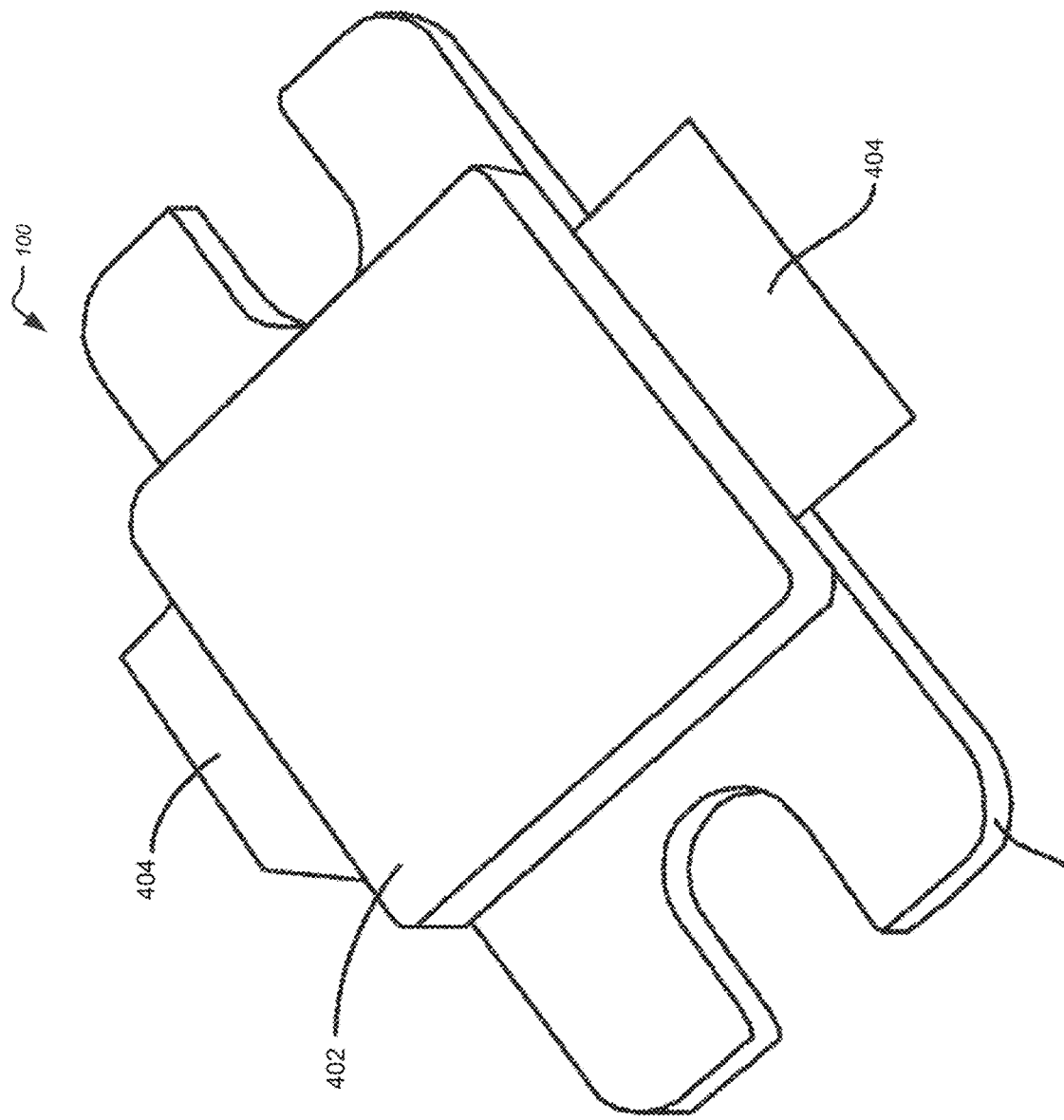
FIG. 10 illustrates a perspective view of a package according to the disclosure.

FIG. 10 illustrates a perspective view of a package according to the disclosure.

Figure 11:
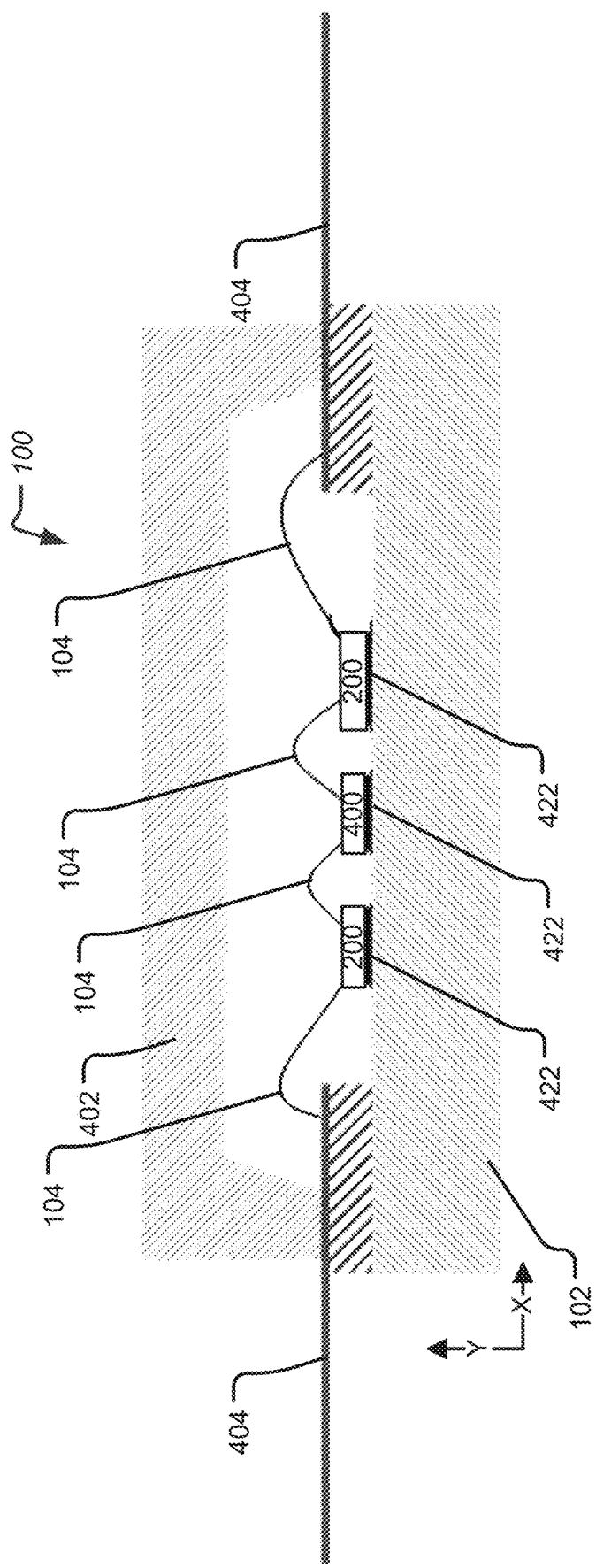
FIG. 11 illustrates a cross-sectional view of the package according to FIG. 10.

FIG. 11 illustrates a cross-sectional view of the package according to FIG. 10.

FIG. 10 and FIG. 11 may include any one or more other features, components, arrangements, and the like as described herein. In particular, FIG. 10 and FIG. 11 illustrate that the device 100 may be implemented as a RF package, a RF amplifier package, a RF power amplifier package, a RF power transistor package, a RF power amplifier transistor package, and/or the like as described herein. The device 100 may include one or more semiconductor devices 400 and the at least one MIM capacitor component 200.

The one or more semiconductor devices 400 may include a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration and/or the like.

The device 100 may be implemented to include an open cavity configuration suitable for use with the at least one MIM capacitor component 200 of the disclosure. In particular, the open cavity configuration may utilize an open cavity package design. In some aspects, the open cavity configuration may include a lid or other enclosure for protecting interconnects, circuit components, the at least one MIM capacitor component 200, the one or more semiconductor devices 400, and/or the like. The device 100 may include a ceramic body 402 and one or more metal contacts 404. In other aspects, the device 100 may include a plurality of the one or more metal contacts 404; and in aspects the device 100 may include a plurality of parallel implementations of the one or more metal contacts 404 and parallel implementations of the one or more semiconductor devices 400.

Inside the device 100, the one or more semiconductor devices 400 may be attached to the support component 102 via a die attach material 422. One or more interconnects 104 may couple the one or more semiconductor devices 400 to a first one of the one or more metal contacts 404, a second one of the one or more metal contacts 404, the at least one MIM capacitor component 200, and/or the like. Additionally, inside the device 100, the at least one MIM capacitor component 200 may be arranged on the support component 102 via a die attach material 422 with the one or more interconnects 104 shown in an exemplary configuration that may connect between the device 100, the at least one MIM capacitor component 200, and/or the one or more semiconductor devices 400. The support component 102 may dissipate the heat generated by the one or more semiconductor devices 400 and the at least one MIM capacitor component 200, while simultaneously isolating and protecting the one or more semiconductor devices 400 and the at least one MIM capacitor component 200 from the outside environment.

Additionally, the one or more semiconductor devices 400 may include one or more transistor dies that may include one or more laterally-diffused metal-oxide semiconductor (LDMOS) transistors, GaN based transistors, Metal Semiconductor Field-Effect transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) transistors, and/or the like.

Figure 12:
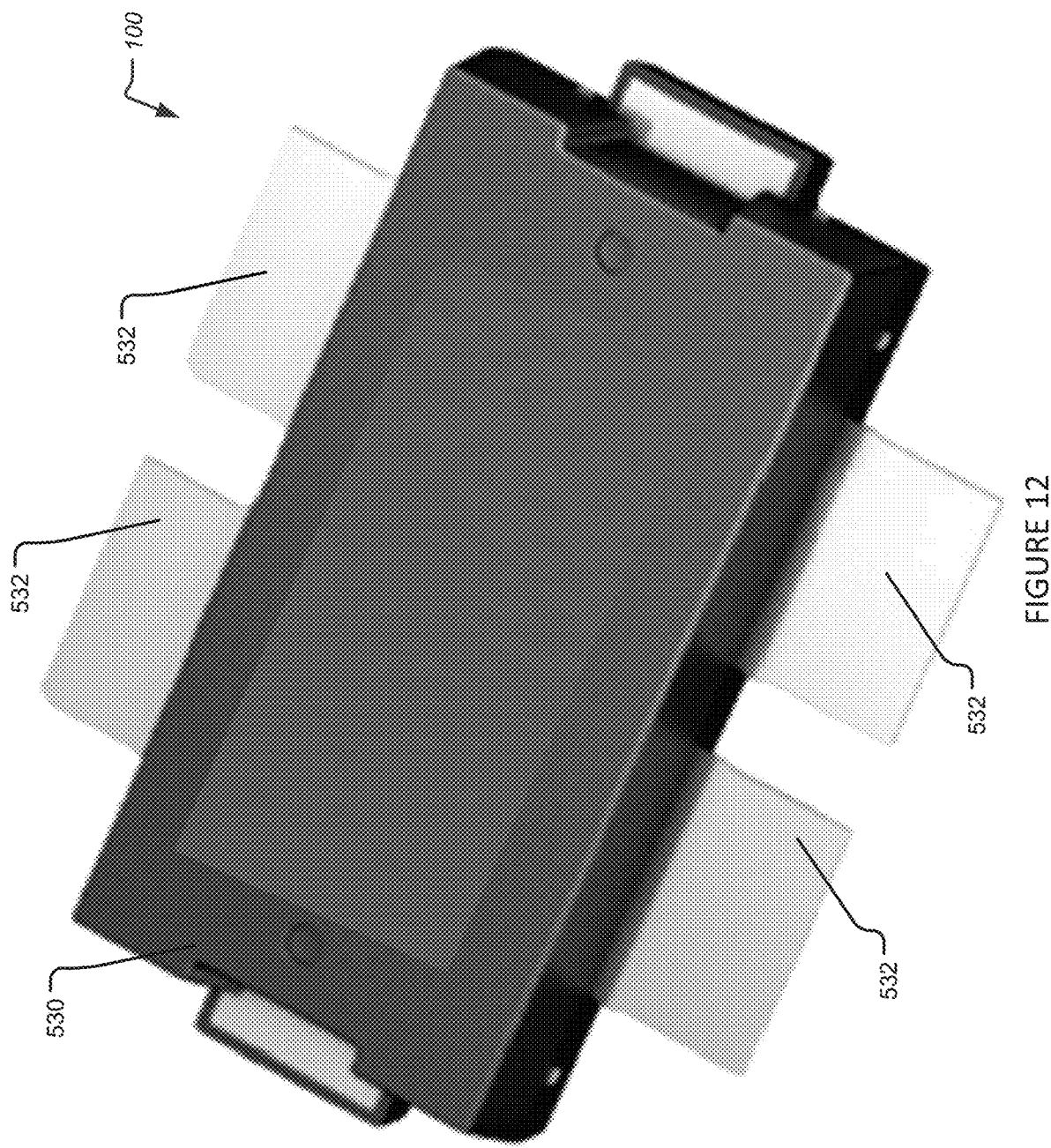
FIG. 12 illustrates a perspective view of a package according to the disclosure.

FIG. 12 illustrates a perspective view of a package according to the disclosure.

Figure 13:
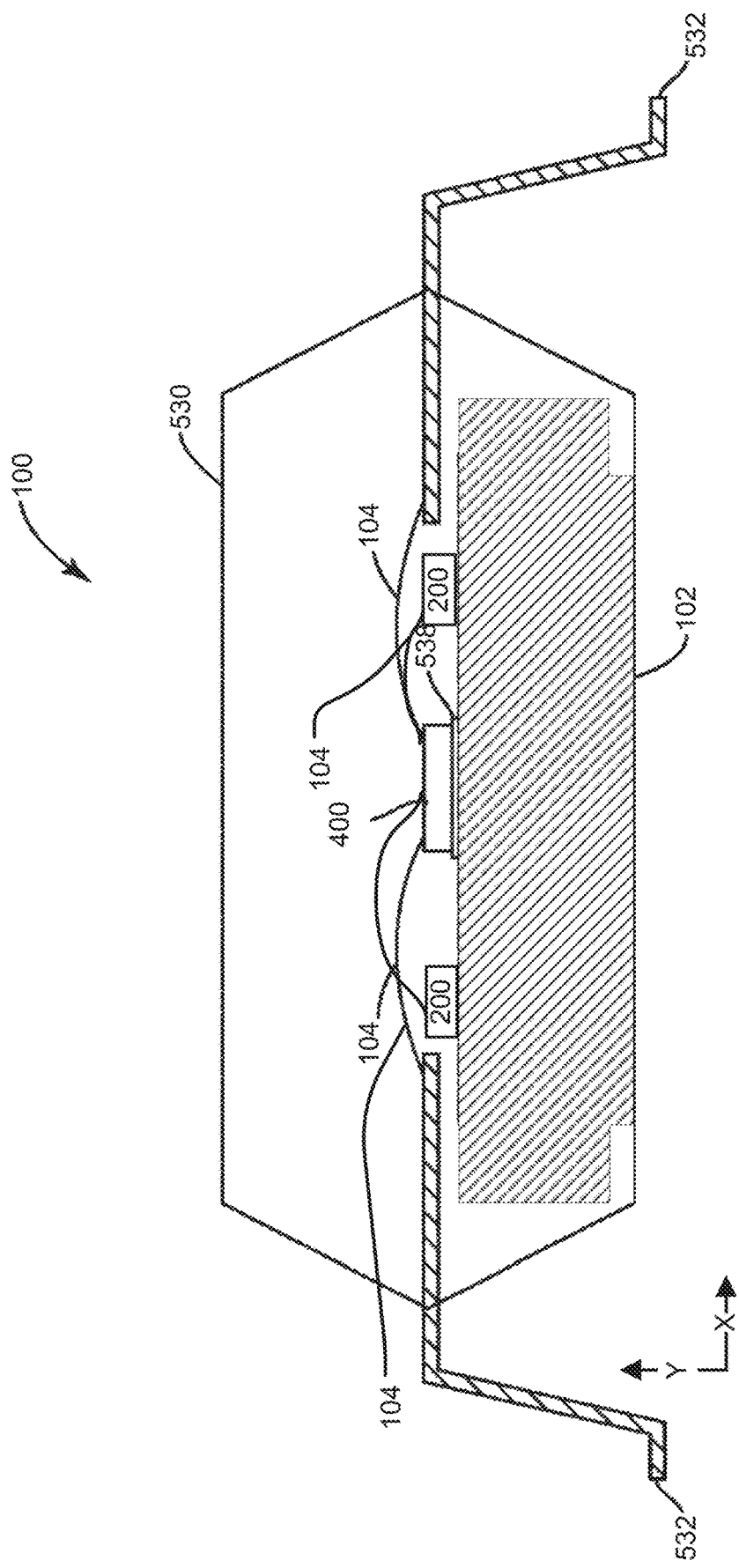
FIG. 13 illustrates a cross-sectional view of the package according to FIG. 12.

FIG. 13 illustrates a cross-sectional view of the package according to FIG. 12.

FIG. 12 and FIG. 13 may include any one or more other features, components, arrangements, and the like as described herein. In particular, FIG. 12 and FIG. 13 show another exemplary implementation of the device 100 that may include any one or more other features, components, arrangements, and the like as described herein. In particular, FIG. 12 and FIG. 13 show the device 100 may be implemented as a RF package, a RF amplifier package, a RF power amplifier package, a RF power transistor package, a RF power amplifier transistor package, and/or the like as described herein. The device 100 may include the one or more semiconductor devices 400, the at least one MIM capacitor component 200, and/or the like.

Additionally, inside the device 100, the at least one MIM capacitor component 200 may be arranged on the support component 102 as described herein with the one or more interconnects 104 shown in an exemplary configuration. The device 100 may include an over-mold 530, one or more input/output pins 532, and the support component 102. The over-mold 530 may substantially surround the one or more semiconductor devices 400, which are mounted on the support component 102 using a die attach material 538. The over-mold 530 may be formed of a plastic or a plastic polymer compound, which may be injection molded around the support component 102, the one or more semiconductor devices 400, the at least one MIM capacitor component 200, and/or the like, thereby providing protection from the outside environment. The one or more semiconductor devices 400 and/or the at least one MIM capacitor component 200 may be coupled to the one or more input/output pins 532 via the one or more interconnects 104.

In one aspect, the over-mold configuration may substantially surround the one or more semiconductor devices 400, the at least one MIM capacitor component 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the at least one MIM capacitor component 200, and/or the like, thereby providing protection for the at least one MIM capacitor component 200, the one or more semiconductor devices 400, and other components of the device 100 from the outside environment.

Figure 14:
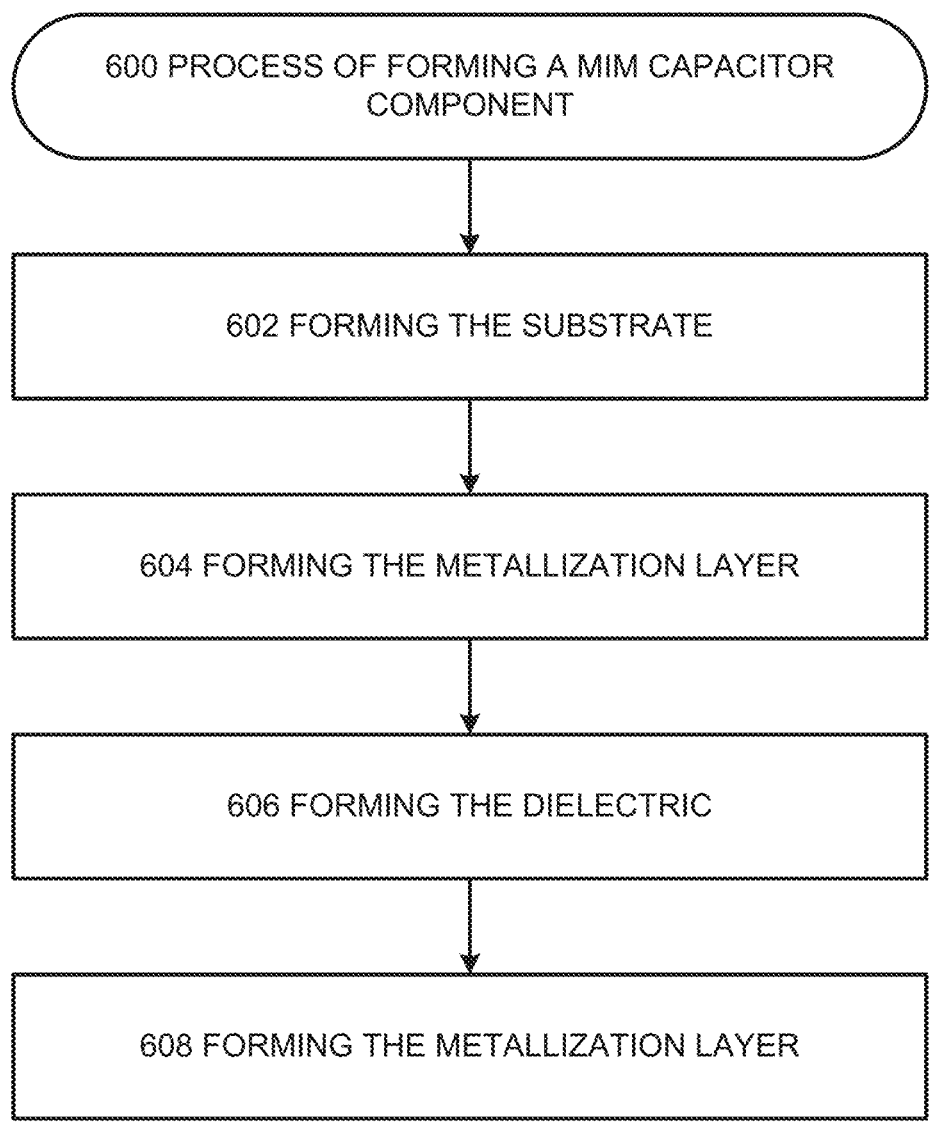
FIG. 14 shows a process of making a MIM capacitor component according to the disclosure.

FIG. 14 shows a process of making a MIM capacitor component according to the disclosure.

FIG. 14 may include any one or more other features, components, arrangements, and the like as described herein. In particular, FIG. 14 illustrates a process of forming a MIM capacitor component 600 that relates to the MIM capacitor component 200 as described herein. It should be noted that the aspects of the process of forming a MIM capacitor component 600 may be performed in a different order consistent with the aspects described herein. Additionally, it should be noted that portions of the process of forming a MIM capacitor component 600 may be performed in a different order consistent with the aspects described herein. Moreover, the process of forming a MIM capacitor component 600 may be modified to have more or fewer processes consistent with the various aspects disclosed herein.

Initially, the process of forming a MIM capacitor component 600 may include a process of forming the substrate 602. More specifically, the substrate 204 may be constructed, configured, and/or arranged as described herein. Additionally, the process of forming a MIM capacitor component 600 may include forming electrical connections such as the vias 228 in the substrate 204.

Further, the process of forming a MIM capacitor component 600 may include forming the metallization layer 604. More specifically, the first metallization layer 240, the second metallization layer 242, the first bottom metal 266, and the second bottom metal 268 may be constructed, configured, and/or arranged as described herein on at least a portion of the substrate 204. The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes. In one or more aspects, the first metallization layer 240, the second metallization layer 242, the first bottom metal 266, and the second bottom metal 268 may be formed in select regions on the substrate 204. In further aspects, the first metallization layer 240, the second metallization layer 242, the first bottom metal 266, and the second bottom metal 268 may be arranged over the entire surface of the substrate 204 and selectively etched and/or otherwise removed from select locations on the substrate 204.

Additionally, the process of forming a MIM capacitor component 600 may include forming the dielectric 606. In one or more aspects, the dielectric layer 262 may be formed in select regions on an upper surface of the substrate 204. In further aspects, the dielectric layer 262 may be arranged over the entire surface of the substrate 204 and selectively etched and/or otherwise removed from select locations on the upper surface of the substrate 204.

Further, the process of forming a MIM capacitor component 600 may include forming the metallization layer 608. More specifically, the top metal 264 may be constructed, configured, and/or arranged as described herein on at least a portion of the dielectric layer 262. The process of forming the metallization layer 608 may include utilizing one or more MMIC manufacturing processes and/or techniques including sputtering, electroplating with photolithography for pattern definition, and/or like processes. In other aspects, the process of forming the metallization layer 608 may include utilizing manufacturing processes and/or techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes. In one or more aspects, the top metal 264 may be formed in select regions on the dielectric layer 262. In further aspects, the top metal 264 may be arranged over the entire surface of the dielectric layer 262 and selectively etched and/or otherwise removed from select locations on the dielectric layer 262.

In some aspects, the process of forming a MIM capacitor component 600 may include manufacturing to form the at least one MIM capacitor component 200 in a wafer, a panel, and/or the like. The process of forming a MIM capacitor component 600 may include cutting the wafer utilizing cutting equipment such as wafer, circuit board, or package sawing equipment to singulate the at least one MIM capacitor component 200 from the wafer, which may have the advantage that the at least one MIM capacitor component 200 may be arranged on dicing tape on a ring frame, which can be directly loaded to the Die Attach equipment for subsequent assembly into device 100. The size of the at least one MIM capacitor component 200 may be optimized to what subsequent assembly equipment like SMT, Dicing and Die Attach Equipment can handle.

Figure 15:
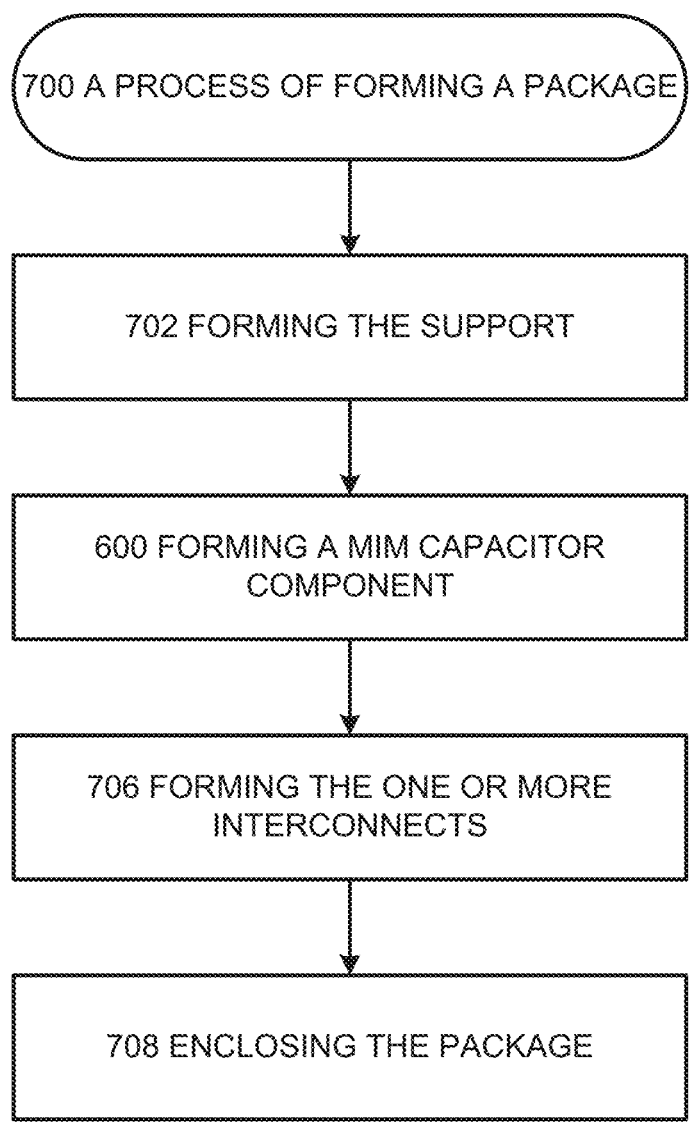
FIG. 15 shows a process of making a package according to the disclosure.

FIG. 15 shows a process of making a package according to the disclosure.

FIG. 15 may include any one or more other features, components, arrangements, and the like as described herein. In particular, FIG. 15 illustrates a process of forming a package 700 that relates to the device 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support component 102 may be constructed, configured, and/or arranged as described herein. In one aspect, the process of forming the support 702 may include forming the support component 102 as a printed circuit board, a MMIC, support, a surface, a package support, a package surface, a package support surface, a flange, a heat sink, a common source heat sink, and/or the like.

The process of forming a package 700 may include a process of forming the MIM capacitor component 600. More specifically, the at least one MIM capacitor component 200 may be constructed, configured, and/or arranged as described herein with reference to FIG. 14 and the associated description thereof. Thereafter, the process of forming the MIM capacitor component 600 may further include attaching the at least one MIM capacitor component 200 to the support component 102. In this regard, the at least one MIM capacitor component 200 and/or the substrate 204 may be mounted on the upper surface of the support component 102 by an adhesive, soldering, sintering, eutectic bonding, ultrasonically welding, and/or the like as described herein.

The process of forming a package 700 may include a process of forming the one or more interconnects 706. More specifically, the one or more interconnects 104 may be constructed, configured, and/or arranged as described herein. In one aspect, the process of forming the one or more interconnects 706 may include forming the one or more interconnects 104 by forming one or more wires, leads, vias, edge platings, circuit traces, tracks, and/or the like. In one aspect, the process of forming the one or more interconnects 706 may include connecting the one or more interconnects 706 by an adhesive, soldering, sintering, eutectic bonding, ultrasonic welding, a clip component, and/or the like as described herein.

The process of forming a package 700 may include a process of enclosing the package 708. More specifically, the device 100 may be constructed, configured, and/or arranged as described herein. In one aspect, the process of enclosing the package 708 may include forming an open cavity configuration, an over-mold configuration, or the like.

In one aspect, the process of forming a package 700 may include processing utilizing a surface mount technology (SMT) line. A surface mount technology (SMT) line may utilize numerous processes including solder printing, component placement, solder reflow, and/or the like. Additional processes may include a flux cleaning step to remove all flux residues, wire bonding, dicing, mounting to dicing tape, dicing, either mechanical sawing or laser cutting, or a combination of both, and component testing. Additionally, the at least one MIM capacitor component 200 may be arranged on dicing tape that may then serve as input for the Die Attach equipment.

Accordingly, the disclosure has provided a configurable metal-insulator-metal (MIM) capacitor, devices implementing a configurable MIM capacitor, processes implementing a configurable MIM capacitor, processes implementing devices with a configurable MIM capacitor, and/or the like that reduce manufacturing complexity, reduce Bill of Materials (BOM) cost, reduce overall costs, and/or the like.

The following are a number of nonlimiting EXAMPLES of aspects of the disclosure. One EXAMPLE includes: EXAMPLE 1. A metal-insulator-metal (MIM) capacitor component includes: a substrate; a dielectric layer; a top metal; a first bottom metal; a second bottom metal; a first metallization layer; and a second metallization layer, where the metal-insulator-metal (MIM) capacitor component is configured to form a first capacitor with the top metal and the first bottom metal having the dielectric layer therebetween; where the metal-insulator-metal (MIM) capacitor component is configured to form a second capacitor with the top metal and the second bottom metal having the dielectric layer therebetween; and where the top metal, the dielectric layer, the first bottom metal, and the second bottom metal are arranged on the substrate.

The above-noted EXAMPLE may further include any one or a combination of more than one of the following EXAMPLES: 2. The metal-insulator-metal (MIM) capacitor component according to EXAMPLE 1 where a center portion of the top metal along a first axis is arranged between the first bottom metal and the second bottom metal. 3. The metal-insulator-metal (MIM) capacitor component according to EXAMPLE 1 where the substrate includes silicon carbide (SiC). 4. The metal-insulator-metal (MIM) capacitor component according to EXAMPLE 1 where the first bottom metal and the second bottom metal are arranged on an upper surface of the substrate. 5. The metal-insulator-metal (MIM) capacitor component according to EXAMPLE 1 where: the dielectric layer is arranged on the first bottom metal and the second bottom metal; and the top metal is arranged on the dielectric layer. 6. The metal-insulator-metal (MIM) capacitor component according to EXAMPLE 1 where the dielectric layer is segmented. 7. The metal-insulator-metal (MIM) capacitor component according to EXAMPLE 1 where the first metallization layer and the second metallization layer are located on a lower surface of the substrate. 8. The metal-insulator-metal (MIM) capacitor component according to EXAMPLE 1 includes: a first electrical connection configured to electrically connect the first metallization layer to the first bottom metal; and a second electrical connection configured to electrically connect the second metallization layer to the second bottom metal. 9. The metal-insulator-metal (MIM) capacitor component according to EXAMPLE 8 where the first electrical connection and the second electrical connection includes vias. 10. The metal-insulator-metal (MIM) capacitor component according to EXAMPLE 1 where the metal-insulator-metal (MIM) capacitor component is configured to be implemented as a shunt capacitor. 11. The metal-insulator-metal (MIM) capacitor component according to EXAMPLE 1 where the metal-insulator-metal (MIM) capacitor component is configured to be implemented as a series capacitor. 12. The metal-insulator-metal (MIM) capacitor component according to EXAMPLE 1 where the first metallization layer is configured to form a first connection, the top metal is configured to form a second connection, and the second metallization layer is configured to form a third connection. 13. The metal-insulator-metal (MIM) capacitor component according to EXAMPLE 1 includes a plurality of the top metal, the first bottom metal, and the second bottom metal configured to implement multiple separate capacitor implementations. 14. A device includes the metal-insulator-metal (MIM) capacitor component according to EXAMPLE 1 and includes: a support component that includes at least one of the following: a printed circuit board, a Monolithic Microwave Integrated Circuit (MMIC), and a support; and one or more connections on a surface of the support component configured to connect to the metal-insulator-metal (MIM) capacitor component. 15. A device includes the metal-insulator-metal (MIM) capacitor component according to EXAMPLE 1 implemented as part of at least one of the following: a ladder configuration, a voltage multiplier configuration, and/or a voltage divider configuration.

One EXAMPLE includes: EXAMPLE 16. A process of implementing a metal-insulator-metal (MIM) capacitor component includes: providing a substrate; providing a dielectric layer; providing a top metal; providing a first bottom metal; providing a second bottom metal; providing a first metallization layer; providing a second metallization layer; configuring a first capacitor with the top metal and the first bottom metal having the dielectric layer therebetween; and configuring a second capacitor with the top metal and the second bottom metal having the dielectric layer therebetween, where the top metal, the dielectric layer, the first bottom metal, and the second bottom metal are arranged on the substrate.

The above-noted EXAMPLE may further include any one or a combination of more than one of the following EXAMPLES: 17. The process of implementing a metal-insulator-metal (MIM) capacitor component according to EXAMPLE 16 includes arranging a center portion of the top metal along a first axis between the first bottom metal and the second bottom metal. 18. The process of implementing a metal-insulator-metal (MIM) capacitor component according to EXAMPLE 16 where the substrate includes silicon carbide (SiC). 19. The process of implementing a metal-insulator-metal (MIM) capacitor component according to EXAMPLE 16 includes arranging the first bottom metal and the second bottom metal on an upper surface of the substrate. 20. The process of implementing a metal-insulator-metal (MIM) capacitor component according to EXAMPLE 16 includes: arranging the dielectric layer on the first bottom metal and the second bottom metal; and arranging the top metal on the dielectric layer. 21. The process of implementing a metal-insulator-metal (MIM) capacitor component according to EXAMPLE 16 includes forming the dielectric layer with one or more segments. 22. The process of implementing a metal-insulator-metal (MIM) capacitor component according to EXAMPLE 16 includes arranging the first metallization layer and the second metallization layer on a lower surface of the substrate. 23. The process of implementing a metal-insulator-metal (MIM) capacitor component according to EXAMPLE 16 includes: configuring a first electrical connection to electrically connecting the first metallization layer to the first bottom metal; and configuring a second electrical connection to electrically connect the second metallization layer to the second bottom metal. 24. The process of implementing a metal-insulator-metal (MIM) capacitor component according to EXAMPLE 23 where the first electrical connection and the second electrical connection includes vias. 25. The process of implementing a metal-insulator-metal (MIM) capacitor component according to EXAMPLE 16 includes configuring the metal-insulator-metal (MIM) capacitor component to be implemented as a shunt capacitor. 26. The process of implementing a metal-insulator-metal (MIM) capacitor component according to EXAMPLE 16 includes configuring the metal-insulator-metal (MIM) capacitor component to be implemented as a series capacitor. 27. The process of implementing a metal-insulator-metal (MIM) capacitor component according to EXAMPLE 16 includes: configuring the first metallization layer to form a first connection; configuring the top metal to form a second connection; and configuring the second metallization layer to form a third connection. 28. The process of implementing a metal-insulator-metal (MIM) capacitor component according to EXAMPLE 16 includes configuring a plurality of the top metal, the first bottom metal, and the second bottom metal to implement multiple separate capacitor implementations. 29. A process of implementing a device includes the process of implementing a metal-insulator-metal (MIM) capacitor component according to EXAMPLE 16 and includes: providing a support component that includes at least one of the following: a printed circuit board, a Monolithic Microwave Integrated Circuit (MMIC), and a support; and configuring one or more connections on a surface of the support component to connect to the metal-insulator-metal (MIM) capacitor component. 30. A process of implementing a device includes configuring the metal-insulator-metal (MIM) capacitor component according to EXAMPLE 16 as part of at least one of the following: a ladder configuration, a voltage multiplier configuration, and/or a voltage divider configuration.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A metal-insulator-metal (MIM) capacitor component comprising:
    a substrate;
    a first bottom metal arranged on the substrate;
    a second bottom metal arranged on the substrate;
    a dielectric layer arranged on the first bottom metal and the second bottom metal;
    a top metal arranged on the dielectric layer;
    a first metallization layer electrically coupled to the first bottom metal and arranged beneath the substrate; and
    a second metallization layer electrically coupled to the second bottom metal and arranged beneath the substrate,
    wherein the first metallization layer and the second metallization layer are located on a lower surface of the substrate;
    wherein the metal-insulator-metal (MIM) capacitor component is configured to form a first capacitor with the top metal and the first bottom metal having the dielectric layer therebetween;
    wherein the metal-insulator-metal (MIM) capacitor component is configured to form a second capacitor with the top metal and the second bottom metal having the dielectric layer therebetween; and
    wherein the top metal, the dielectric layer, the first bottom metal, and the second bottom metal are arranged on the substrate.

2. The metal-insulator-metal (MIM) capacitor component according to claim 1 wherein a center portion of the top metal along a first axis is arranged between and vertically above the first bottom metal and the second bottom metal, wherein the top metal is arranged on the dielectric layer, the first bottom metal is arranged on the substrate, and the second bottom metal is arranged on the substrate.

3. The metal-insulator-metal (MIM) capacitor component according to claim 1 wherein the substrate comprises silicon carbide (SIC).

4. The metal-insulator-metal (MIM) capacitor component according to claim 1 wherein the first bottom metal and the second bottom metal are arranged on an upper surface of the substrate.

5. The metal-insulator-metal (MIM) capacitor component according to claim 1 wherein:
    the dielectric layer is arranged on the first bottom metal and the second bottom metal; and
    the top metal is arranged on the dielectric layer.

6. The metal-insulator-metal (MIM) capacitor component according to claim 1 wherein the dielectric layer is segmented.

7. The metal-insulator-metal (MIM) capacitor component according to claim 1 further comprising:
- a first electrical connection configured to electrically connect the first metallization layer to the first bottom metal; and
- a second electrical connection configured to electrically connect the second metallization layer to the second bottom metal.

8. The metal-insulator-metal (MIM) capacitor component according to claim 7 wherein the first electrical connection and the second electrical connection comprise vias.

9. The metal-insulator-metal (MIM) capacitor component according to claim 1 wherein the metal-insulator-metal (MIM) capacitor component is configured to be implemented as a shunt capacitor.

10. The metal-insulator-metal (MIM) capacitor component according to claim 1 wherein the metal-insulator-metal (MIM) capacitor component is configured to be implemented as a series capacitor.

11. The metal-insulator-metal (MIM) capacitor component according to claim 1 wherein the first metallization layer is configured to form a first connection, the top metal is configured to form a second connection, and the second metallization layer is configured to form a third connection.

12. The metal-insulator-metal (MIM) capacitor component according to claim 1 further comprising a plurality of the top metal, the first bottom metal, and the second bottom metal configured to implement multiple separate capacitor implementations.

13. A device comprising the metal-insulator-metal (MIM) capacitor component according to claim 1 and further comprising:
- a support component that comprises at least one of the following: a printed circuit board, a Monolithic Microwave Integrated Circuit (MMIC), and a support; and
- one or more connections on a surface of the support component configured to connect to the metal-insulator-metal (MIM) capacitor component.

14. A device comprising the metal-insulator-metal (MIM) capacitor component according to claim 1 implemented as part of at least one of the following: a ladder configuration, a voltage multiplier configuration, and/or a voltage divider configuration.

15. A metal-insulator-metal (MIM) capacitor component comprising:
- a substrate;
- a first bottom metal arranged on the substrate;
- a second bottom metal arranged on the substrate;
- a dielectric layer arranged on the first bottom metal and the second bottom metal;
- a top metal arranged on the dielectric layer;
- a first metallization layer electrically coupled to the first bottom metal and arranged beneath the substrate; and
- a second metallization layer electrically coupled to the second bottom metal and arranged beneath the substrate,
- wherein the first metallization layer and the second metallization layer are located on a lower surface of the substrate;
- wherein the top metal and the first bottom metal are configured to form a first capacitor;
- wherein the top metal and the second bottom metal are configured to form a second capacitor; and
- wherein the top metal, the dielectric layer, the first bottom metal, and the second bottom metal are arranged on the substrate.

16. The metal-insulator-metal (MIM) capacitor component according to claim 15 wherein a center portion of the top metal along a first axis is arranged between the first bottom metal and the second bottom metal, wherein the top metal is arranged on the dielectric layer, the first bottom metal is arranged on the substrate, and the second bottom metal is arranged on the substrate.

17. The metal-insulator-metal (MIM) capacitor component according to claim 15 wherein the substrate comprises silicon carbide (SiC).

18. The metal-insulator-metal (MIM) capacitor component according to claim 15 wherein the first bottom metal and the second bottom metal are arranged on an upper surface of the substrate.

19. The metal-insulator-metal (MIM) capacitor component according to claim 15 wherein:
- the dielectric layer is arranged on the first bottom metal and the second bottom metal; and
- the top metal is arranged on the dielectric layer.

20. The metal-insulator-metal (MIM) capacitor component according to claim 15 wherein the dielectric layer is segmented.

21. The metal-insulator-metal (MIM) capacitor component according to claim 15 further comprising:
- a first electrical connection configured to electrically connect the first metallization layer to the first bottom metal; and
- a second electrical connection configured to electrically connect the second metallization layer to the second bottom metal.

22. The metal-insulator-metal (MIM) capacitor component according to claim 21 wherein the first electrical connection and the second electrical connection comprise vias.

23. The metal-insulator-metal (MIM) capacitor component according to claim 15 wherein the metal-insulator-metal (MIM) capacitor component is configured to be implemented as a shunt capacitor.

24. The metal-insulator-metal (MIM) capacitor component according to claim 15 wherein the metal-insulator-metal (MIM) capacitor component is configured to be implemented as a series capacitor.

25. The metal-insulator-metal (MIM) capacitor component according to claim 15 wherein the first metallization layer is configured to form a first connection, the top metal is configured to form a second connection, and the second metallization layer is configured to form a third connection.

26. The metal-insulator-metal (MIM) capacitor component according to claim 15 further comprising a plurality of the top metal, the first bottom metal, and the second bottom metal configured to implement multiple separate capacitor implementations.

27. A device comprising the metal-insulator-metal (MIM) capacitor component according to claim 15 and further comprising:
- a support component that comprises at least one of the following: a printed circuit board, a Monolithic Microwave Integrated Circuit (MMIC), and a support; and
- one or more connections on a surface of the support component configured to connect to the metal-insulator-metal (MIM) capacitor component.

28. A device comprising the metal-insulator-metal (MIM) capacitor component according to claim 15 implemented as part of at least one of the following: a ladder configuration, a voltage multiplier configuration, and/or a voltage divider configuration.

* * * * *